(12) United States Patent
Ikeda

(10) Patent No.: US 8,934,299 B2
(45) Date of Patent: Jan. 13, 2015

(54) MEMORY ELEMENT AND PROGRAMMABLE LOGIC DEVICE

(71) Applicant: Semiconductor Energy Laboratory Co., Ltd., Atsugi-shi, Kanagawa-ken (JP)

(72) Inventor: Takayuki Ikeda, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 13/940,312

(22) Filed: Jul. 12, 2013

(65) Prior Publication Data

US 2014/0021474 A1   Jan. 23, 2014

(30) Foreign Application Priority Data

Jul. 18, 2012   (JP) ................. 2012-159449

(51) Int. Cl.
*G11C 16/04* (2006.01)
*H01L 27/115* (2006.01)
*H03K 19/177* (2006.01)
*H01L 27/12* (2006.01)
*H01L 27/118* (2006.01)
*H01L 27/088* (2006.01)
*H01L 27/06* (2006.01)

(52) U.S. Cl.
CPC ........ *H01L 27/0629* (2013.01); *H01L 27/1156* (2013.01); *H01L 27/088* (2013.01); *G11C 16/0433* (2013.01); *H03K 19/1776* (2013.01); *H01L 27/0688* (2013.01); *H01L 27/1225* (2013.01); *H01L 27/11803* (2013.01)
USPC ............. 365/185.05; 365/185.18; 365/185.26

(58) Field of Classification Search
USPC .......................... 365/185.05, 185.18, 185.026
See application file for complete search history.

(56) References Cited

U.S. PATENT DOCUMENTS

| 6,127,702 | A | 10/2000 | Yamazaki et al. |
| 2010/0148171 | A1 | 6/2010 | Hayashi et al. |
| 2011/0101351 | A1 | 5/2011 | Yamazaki |
| 2011/0227062 | A1 | 9/2011 | Kato et al. |
| 2011/0317474 | A1 | 12/2011 | Kato |
| 2012/0014157 | A1 | 1/2012 | Kato et al. |

FOREIGN PATENT DOCUMENTS

JP   2011-171702 A   9/2011

OTHER PUBLICATIONS

Tomoyuki Ishii et al.; "A Poly-Silicon TFT With a Sub-5-nm Thick Channel for Low-Power Gain Cell Memory in Mobile Applications"; IEEE Transactions on Electron Devices; Nov. 1, 2004; pp. 1805-1810; vol. 51, No. 11.

(Continued)

*Primary Examiner* — Connie Yoha
(74) *Attorney, Agent, or Firm* — Fish & Richardson P.C.

(57) ABSTRACT

To provide a memory element where a desired potential can be stored as data without an increase in the number of power source potentials. The memory element stores data in a node which is brought into a floating state by turning off a transistor a channel of which is formed in an oxide semiconductor layer. The potential of a gate of the transistor can be increased by capacitive coupling between the gate and a source of the transistor. With the structure, a desired potential can be stored as data without an increase in the number of power source potentials.

20 Claims, 11 Drawing Sheets

(56) References Cited

OTHER PUBLICATIONS

Wonchan Kim et al.; "An Experimental High-Density DRAM Cell with a Built-in Gain Stage"; IEEE Journal of Solid-State Circuits; Aug. 1, 1994; pp. 978-981; vol. 29, No. 8.

Shoji Shukuri et al.; "A Complementary Gain Cell Technology for Sub-1V Supply DRAMs"; IEDM 92: Technical Digest of International Electron Devices Meeting; Dec. 13, 1992; pp. 1006-1008.

Shoji Shukuri et al.; "A Semi-Static Complementary Gain Cell Technology for Sub-1 V Supply DRAM's"; IEEE Transactions on Electron Devices; Jun. 1, 1994; pp. 926-931; vol. 41, No. 6.

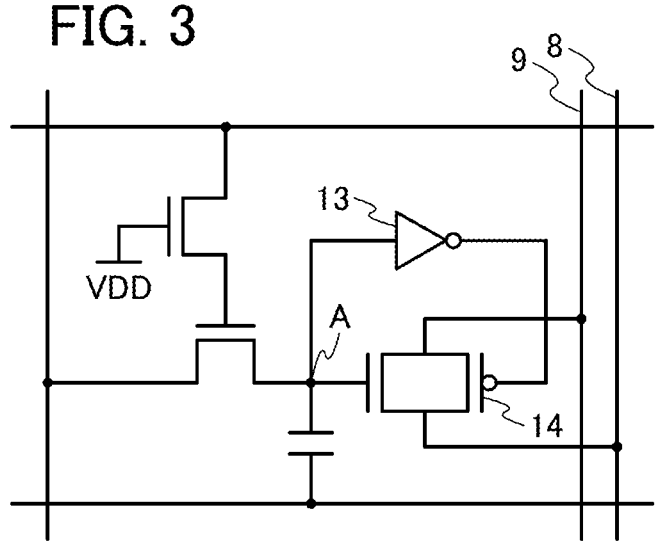

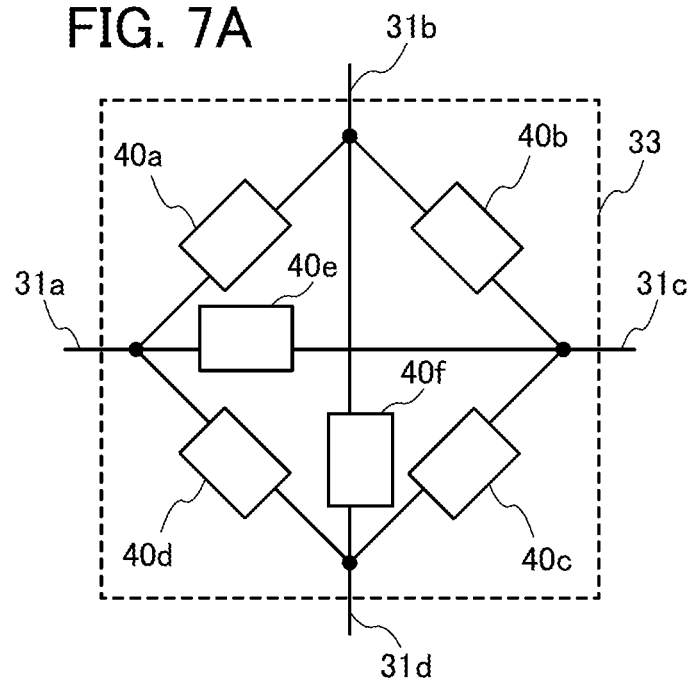
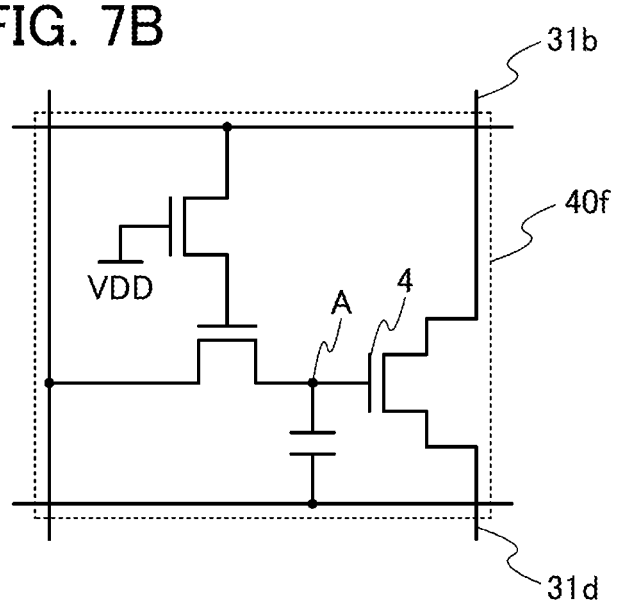

MEMORY ELEMENT AND PROGRAMMABLE LOGIC DEVICE

BACKGROUND OF THE INVENTION

1. Field of the Invention

The present invention relates to a memory element. In particular, the present invention relates to a memory element where data is stored in a node which is brought into a floating state by turning off a transistor a channel of which is formed in an oxide semiconductor layer. The present invention relates to a semiconductor device (e.g., a programmable logic device) including the memory element.

2. Description of the Related Art

Transistors using an oxide semiconductor as a material of an active layer have been developed. For example, Patent Document 1 discloses a memory element where data can be stored in a node which is brought into a floating state by turning off the transistor. Note that the memory element has a nonvolatile property (see paragraph 0044 in Patent Document 1).

REFERENCE

[Patent Document 1] Japanese Published Patent Application No. 2011-171702

SUMMARY OF THE INVENTION

For driving electronic devices, a plurality of power source potentials with different levels are needed. For example, to drive a digital circuit, a high power source potential corresponding to data "1" and a low power source potential corresponding to data "0" are needed at least. Note that the number of power source potentials needed for driving an electronic device is preferably small, which can simplify the structure of the electronic device.

The memory element disclosed in Patent Document 1 is preferably driven using only a high power source potential corresponding to data "1" and a low power source potential corresponding to data "0". Note that in the memory element disclosed in Patent Document 1, data is written to a predetermined node through a source and a drain of an n-channel transistor. In this case, a potential equal to the high power source potential corresponding to data "1" cannot be written to the node.

Specifically, in the case where the high power source potential corresponding to data "1" is written to the node, the transistor is turned on while the high power source potential is supplied to a gate and the drain of the transistor. In addition, the transistor is turned off when the potential of the source of the transistor is increased to a potential which is obtained by subtracting the threshold voltage of the transistor from the high power source potential. Note that the node is electrically connected to the source of the transistor. Accordingly, the potential of the node is not increased to exceed a potential which is obtained by subtracting the threshold voltage of the transistor from the high power source potential.

Here, in the case where the potential of the node is lower than the high power source potential corresponding to data "1", detection of the data might be delayed or become difficult. In view of the problem, an object of one embodiment of the present invention is to provide a memory element where a desired potential can be stored as data without an increase in the number of power source potentials.

One embodiment of the present invention is a memory element where data is stored in a node which is brought into a floating state by turning off a transistor. In addition, one embodiment of the present invention is a memory element where the potential of a gate of the transistor can be increased by capacitive coupling between the gate and a source of the transistor.

For example, one embodiment of the present invention is a memory element that store data in a node which is brought into a floating state by turning off a first n-channel transistor. The memory element includes a first wiring configured to supply a high power source potential and a low power source potential, a second wiring configured to supply the high power source potential, and a second n-channel transistor, a gate of which is electrically connected to the second wiring, one of a source and a drain of which is electrically connected to the first wiring, and the other of the source and the drain of which is electrically connected to a gate of the first n-channel transistor.

In the memory element of one embodiment of the present invention, the potential of a gate of the first transistor can be increased by increasing the potential of the first wiring to the high power source potential corresponding to data "1". Specifically, the potential of the gate of the first transistor can be increased to a potential which is obtained by subtracting the threshold voltage of the second transistor from the high power source potential. In this case, the first transistor is turned on. Then, in the memory element, the potential of a drain of the first transistor can be increased to the high power source potential. In this case, the potential of the gate of the first transistor is further increased by capacitive coupling between the gate and a source of the first transistor. Therefore, the potential of the source of the first transistor can be increased to the high power source potential. That is, in the memory element, the potential of a node where data is stored can be increased to the high power source potential. As a result, in the memory element, detection of data can be performed more quickly and more easily.

BRIEF DESCRIPTION OF THE DRAWINGS

FIG. 3 illustrates a specific example of a memory element.

FIG. 7A illustrates a structural example of a wiring selection circuit and FIG. 7B illustrates a structural example of a programmable switch.

DETAILED DESCRIPTION OF THE INVENTION

Embodiments of the present invention will be described below in detail. Note that the present invention is not limited to the description below, and a variety of changes can be made without departing from the spirit and scope of the present invention. Therefore, the invention should not be construed as being limited to the description below.

Structural Example of Memory Element

Figure 1A:
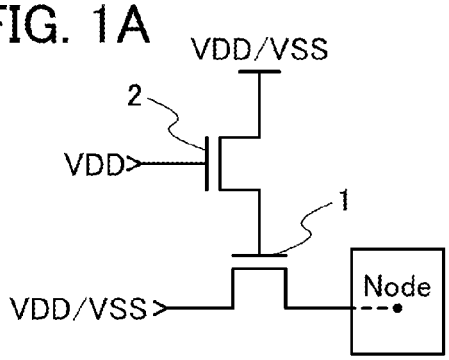
FIG. 1A illustrates a structural example of a memory element and FIGS. 1B to 1F show an example of a method for driving a memory element.

FIG. 1A is a circuit diagram illustrating a structural example of the memory element of one embodiment of the present invention. The memory element illustrated in FIG. 1A includes a transistor 1a channel of which is formed in an oxide semiconductor layer; a node which is brought into a floating state by turning off the transistor 1 (Node); and a transistor 2 a gate of which is electrically connected to a wiring for supplying a high power source potential (VDD), one of a source and a drain of which is electrically connected to a wiring for supplying the high power source potential (VDD) or a low power source potential (VSS), and the other of the source and the drain of which is electrically connected to a gate of the transistor 1. Note that in the memory element illustrated in FIG. 1A, data can be stored in the node (Node). The transistors 1 and 2 are n-channel transistors.

Note that as a material for an active layer of the transistor 2, various kinds of semiconductor materials can be used. For example, a material such as silicon or germanium can be used. A compound semiconductor or an oxide semiconductor can be also used. An oxide semiconductor can be used, in which case the transistor 1 and the transistor 2 can be formed in the same process. Silicon or a compound semiconductor can be used, in which case electric charge in the gate of the transistor 1 can be charged or discharged at high speed.

Example of Method for Driving Memory Element

FIGS. 1B to 1F are circuit diagrams showing an example of a method for driving the memory element illustrated in FIG. 1A. Specifically, FIGS. 1B to 1F illustrate an example of a driving method when the high power source potential (VDD) corresponding to the data "1" is written to the memory element. Note that in FIGS. 1B to 1F, a transistor in an on state is marked with a circle and a transistor in an off state is marked with a cross.

First, the potential of the wiring which is electrically connected to the one of the source and the drain of the transistor 2 is increased from the low power source potential (VSS) to the high power source potential (VDD) (see FIG. 1B), which results in an increase in a potential of the gate of the transistor 1. Accordingly, the transistor 1 is turned on. Here, the potential of a wiring which is electrically connected to the node (Node) through a source and a drain of the transistor 1 is the low power source potential (VSS). Therefore, the potential of the node (Node) becomes the low power source potential (VSS). The transistor 2 is turned off at the time when the potential of the gate of the transistor 1 is increased to a potential which is obtained by subtracting the threshold voltage of the transistor 2 (Vth2) from the high power source potential (VDD) (see FIG. 1C).

Figure 1B:
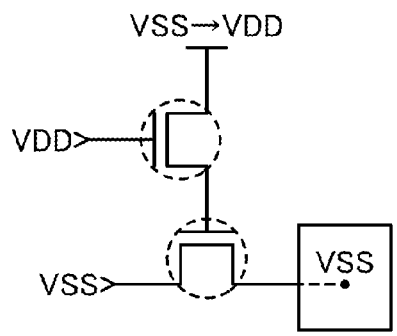
Figure 1C:
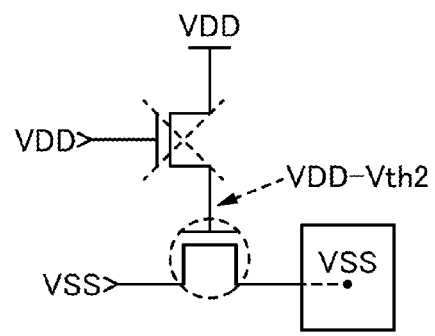
Figure 1D:
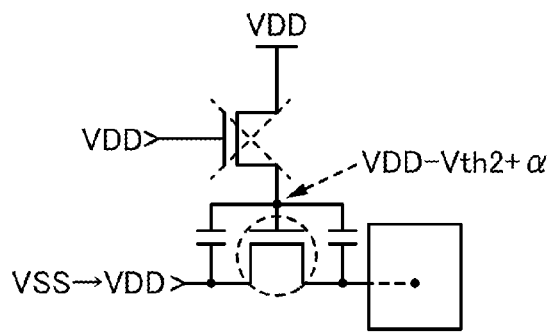
Figure 1E:
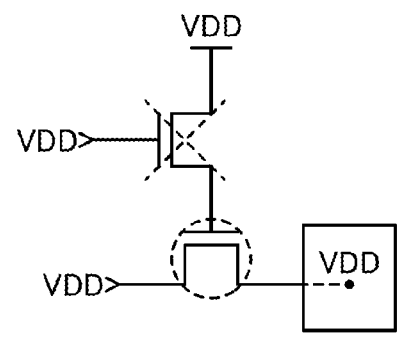

Next, the potential of the wiring which is electrically connected to the node (Node) through the source and the drain of the transistor 1 is increased from the low power source potential (VSS) to the high power source potential (VDD) (see FIG. 1D). Accordingly, the potential of the node (Node) is increased. Further, capacitive coupling between the gate of the transistor 1 and the source of the transistor 1 (the node (Node)) increases the potential of the gate of the transistor 1. Therefore, the potential of the node (Node) is increased to the high power source potential (VDD) (see FIG. 1E).

Figure 1F:
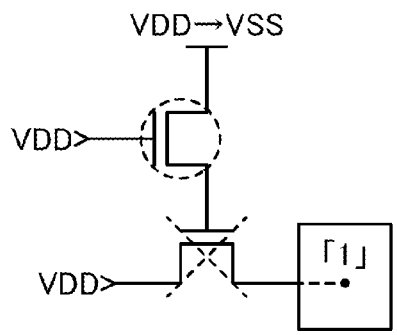

Next, the potential of the wiring which is electrically connected to the one of the source and the drain of the transistor 2 is decreased from the high power source potential (VDD) to the low power source potential (VSS) (see FIG. 1F). Accordingly, the transistor 2 is turned on. Then, the potential of the gate of the transistor 1 is decreased to the low power source potential (VSS), which results in turning off the transistor 1.

In the above manner, data "1" can be written to the memory element illustrated in FIG. 1A.

As described above, as data, the memory element illustrated in FIG. 1A can store the potential higher than a potential which is obtained by subtracting the threshold voltage of the transistor 1 from the high power source potential (VDD). Therefore, data can be detected more quickly and more easily from the memory element.

Specific Example of Memory Element

FIGS. 2A to 2D and FIG. 3 are specific examples of the memory element illustrated in FIG. 1A.

(1) Specific Example 1

Figure 2A:
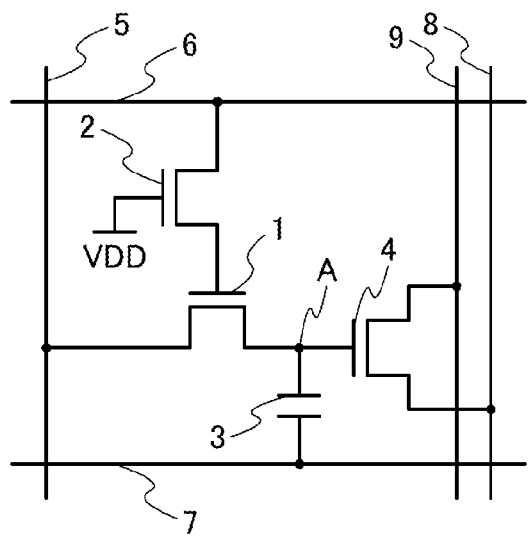
FIGS. 2A to 2D illustrate specific examples of a memory element.

The memory element illustrated in FIG. 2A includes wirings 5 to 9; the transistor 2 the gate of which is electrically connected to the wiring for supplying the high power source potential (VDD) and the one of the source and the drain of which is electrically connected to the wiring 6; the transistor 1 the gate of which is electrically connected to the other of the source and the drain of the transistor 2, the one of the source and the drain of which is electrically connected to the wiring 5, and the other of the source and the drain of which is electrically connected to a node A; a capacitor 3 one of electrodes of which is electrically connected to the node A and the other of the electrodes of which is electrically connected to the wiring 7; and a transistor 4 a gate of which is electrically connected to the node A, one of a source and a drain of which is electrically connected to the wiring 8, and the other of the source and the drain of which is electrically connected to the wiring 9.

Note that in the memory element illustrated in FIG. 2A, data can be stored in the node A. Specifically, in the memory element illustrated in FIG. 2A, the switching of the transistor 4 can be controlled in accordance with the data. Further, whether the transistor 4 is in an on state is determined, whereby the data can be read.

In addition, the transistor 4 is an n-channel transistor. As a material for an active layer of the transistor 4, various semiconductor materials can be used, as in the transistor 2. An oxide semiconductor can be used as a material for the active layers of the transistors 2 and 4, in which case the transistors 2 and 4 can be formed in the same process as the transistor 1. Silicon, a compound semiconductor, or the like can be used as a material for the active layer of the transistor 4, in which case whether the transistor 4 is in an on state can be determined at high speed.

In addition, a material used for the active layer of the transistor 2 and a material used for the active layer of the transistor 4 can be different from each other, in which case a transistor suitable for each of the transistors 2 and 4 can be selected. Specifically, a transistor with high withstand voltage is preferably used as the transistor 2. This is because in the memory element illustrated in FIG. 2A, the other of the source and the drain of the transistor 2 (the gate of the transistor 1) has a high potential exceeding the high power source potential (VDD). On the other hand, a transistor with high mobility is preferably used as the transistor 4. In view of the above, it is preferable that a material used for the active layer of the transistor 2 be an oxide semiconductor and a material used for the active layer of the transistor 4 be silicon, a compound semiconductor, or the like. This is because the transistors 1 and 2 each of which has a thick gate insulating film to have high withstand voltage can be manufactured in the same process and the transistor 4 can have high mobility.

The wirings 5 and 6 are wirings for supplying the high power source potential (VDD) or the low power source potential (VSS). The wiring 7 may be a wiring for supplying the high power source potential (VDD) or the low power source potential (VSS) or a wiring for supplying only one of the high power source potential (VDD) and the low power source potential (VSS). The wirings 8 and 9 may be wirings for supplying the high power source potential (VDD) or the low power source potential (VSS) or wirings for electrically connecting the memory element and another circuit.

(2) Specific Example 2

Figure 2B:
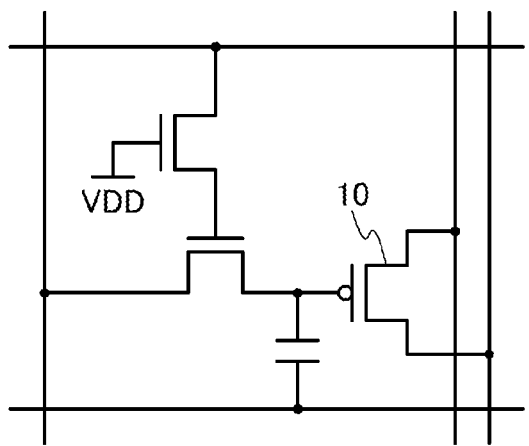

A memory element illustrated in FIG. 2B has a structure similar to that of the memory element illustrated in FIG. 2A except that the transistor 4 is replaced with a transistor 10. The transistor 10 is a p-channel transistor. As a material for an active layer of the transistor 10, various semiconductor materials can be used, as in the transistor 2.

(3) Specific Example 3

Figure 2C:
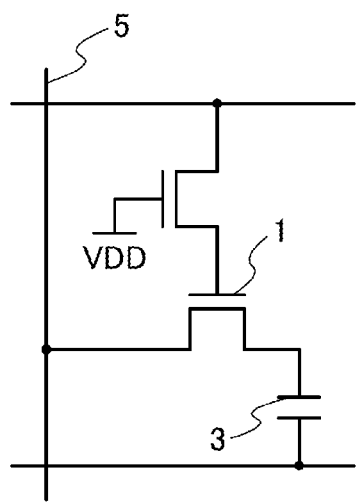

A memory element illustrated in FIG. 2C has a structure similar to that of the memory element illustrated in FIG. 2A except that the transistor 4 and the wirings 8 and 9 are not provided. Note that in the memory element illustrated in FIG. 2C, data is stored by accumulating electric charge in the capacitor 3. The data can be read by detecting a change in potential of the wiring 5 when the transistor 1 is turned on.

(4) Specific Example 4

Figure 2D:
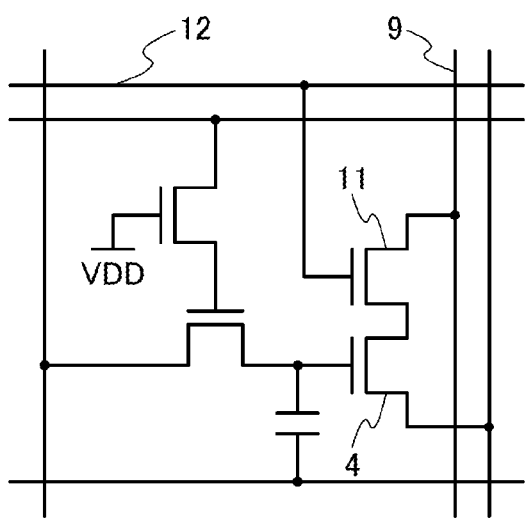

A memory element illustrated in FIG. 2D has a structure similar to that of the memory element illustrated in FIG. 2A except that a transistor 11 a gate of which is electrically connected to a wiring 12, one of a source and a drain of which is electrically connected to the other of the source and the drain of the transistor 4, and the other of the source and the drain of which is electrically connected to the wiring 9 is provided. In the memory element illustrated in FIG. 2D, whether data stored in the memory element is read can be decided by controlling the potential of the wiring 12.

Note that the transistor 11 is an n-channel transistor. As a material for an active layer of the transistor 11, various semiconductor materials can be used, as in the transistor 2.

(5) Specific Example 5

The memory element illustrated in FIG. 2D can have a structure in which p-channel transistors are provided instead of the transistors 4 and 11. As a material for active layers of the p-channel transistors, various semiconductor materials can be used, as in the transistor 2.

(6) Specific Example 6

A memory element illustrated in FIG. 3 has a structure similar to that of the memory element illustrated in FIG. 2A except that an inverter 13 an input terminal of which is electrically connected to the node A and a transistor 14 a gate of which is electrically connected to an output terminal of the inverter 13, one of a source and a drain of which is electrically connected to the wiring 8, and the other of the source and the drain of which is electrically connected to the wiring 9 are provided. The transistor 14 is a p-channel transistor. As a material for active layers of the transistors in the inverter 13 and an active layer of the transistor 14, various semiconductor materials can be used, as in the transistor 2.

Modification Example of Memory Element

Figure 4A:
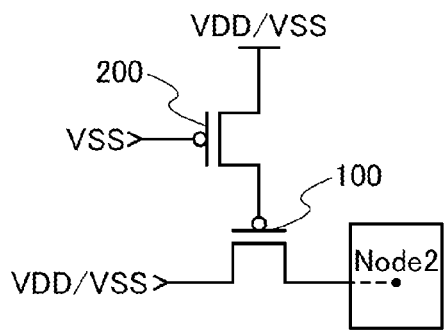
FIG. 4A illustrates a structural example of a memory element and FIGS. 4B to 4F show an example of a method for driving a memory element.
Figure 4B:
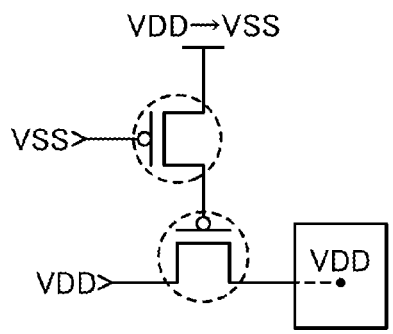
Figure 4C:
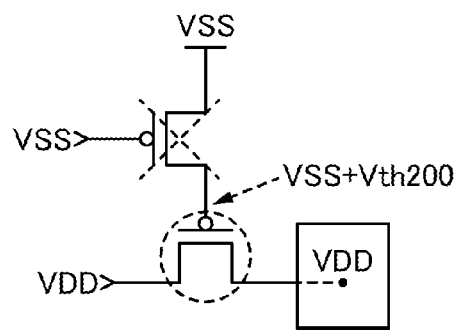

FIG. 4A is a circuit diagram of a modification example of the memory element of one embodiment of the present invention. The memory element illustrated in FIG. 4A includes a transistor 100; a node which is brought into a floating state by turning off the transistor 100 (Node2); and a transistor 200 a gate of which is electrically connected to a wiring for supplying a low power source potential (VSS), one of a source and a drain of which is electrically connected to a wiring for supplying the high power source potential (VDD) or a low power source potential (VSS), and the other of the source and the drain of which is electrically connected to a gate of the transistor 100. Note that in the memory element illustrated in FIG. 4A, data can be stored in the node (Node2). The transistors 100 and 200 are p-channel transistors.

Note that as a material for active layers of the transistors 100 and 200, various kinds of semiconductor material can be used. For example, a material such as silicon or germanium can be used. A compound semiconductor or an oxide semiconductor can be also used.

FIGS. 4B to 4F are circuit diagrams showing an example of a method for driving the memory element illustrated in FIG. 4A. Specifically, FIGS. 4B to 4F illustrate an example of a driving method when the low power source potential (VSS) corresponding to the data "0" is written to the memory element. Note that in FIGS. 4B to 4F, a transistor in an on state is marked with a circle and a transistor in an off state is marked with a cross.

First, the potential of the wiring which is electrically connected to the one of the source and the drain of the transistor 200 is decreased from the high power source potential (VDD) to the low power source potential (VSS) (see FIG. 4B), which results in a decrease in the gate of the transistor 100. Accordingly, the transistor 100 is turned on. Here, the potential of a wiring which is electrically connected to the node (Node2) through a source and a drain of the transistor 100 is the high power source potential (VDD). Therefore, the potential of the node (Node2) becomes the high power source potential (VDD). The transistor 200 is turned off at the time when the potential of the gate of the transistor 100 is decreased to a potential which is obtained by adding the threshold voltage of the transistor 200 (Vth200) to the low power source potential (VSS) (see FIG. 4C).

Figure 4D:
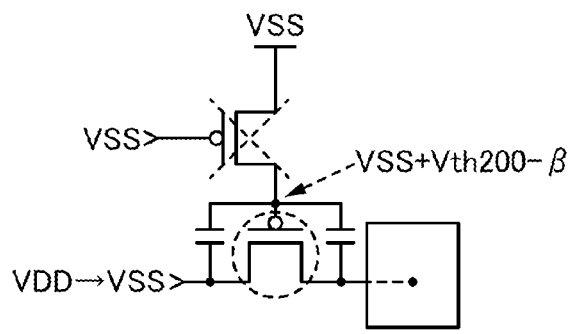
Figure 4E:
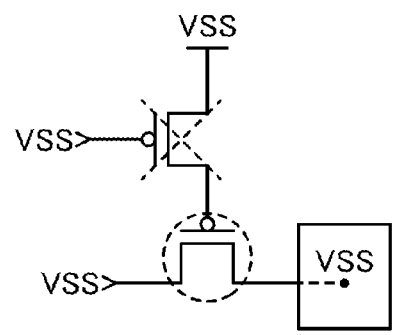

Next, the potential of the wiring which is electrically connected to the node (Node2) through the source and the drain of the transistor 100 is decreased from the high power source potential (VDD) to the low power source potential (VSS) (see FIG. 4D). Accordingly, the potential of the node (Node2) is decreased. Further, capacitive coupling between the gate of the transistor 100 and the source of the transistor 100 (the node (Node2)) decreases the potential of the gate of the transistor 100. Therefore, the potential of the node (Node2) is decreased to the low power source potential (VSS) (see FIG. 4E).

Figure 4F:
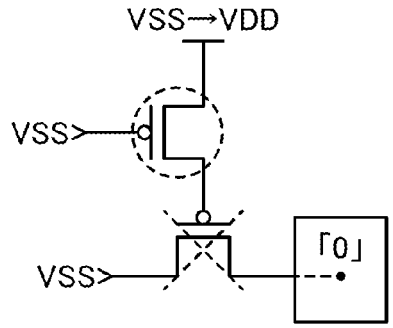

Next, the potential of the wiring which is electrically connected to the one of the source and the drain of the transistor 200 is increased from the low power source potential (VSS) to the high power source potential (VDD) (see FIG. 4F). Accordingly, the transistor 200 is turned on. Then, the potential of the gate of the transistor 100 is increased to the high power source potential (VDD), which results in turning off the transistor 100.

In the above manner, data "0" can be written to the memory element illustrated in FIG. 4A.

As described above, as data, the memory element illustrated in FIG. 4A can store the potential lower than a potential which is obtained by adding the threshold voltage of the transistor 100 to the low power source potential (VSS). Therefore, data can be detected more quickly and more easily from the memory element.

Application Example of Memory Element

FIG. 5, FIGS. 6A and 6B, FIGS. 7A and 7B, and FIG. 8 illustrate an example of a semiconductor device having the memory element.

(1) Application Example 1

Figure 5:
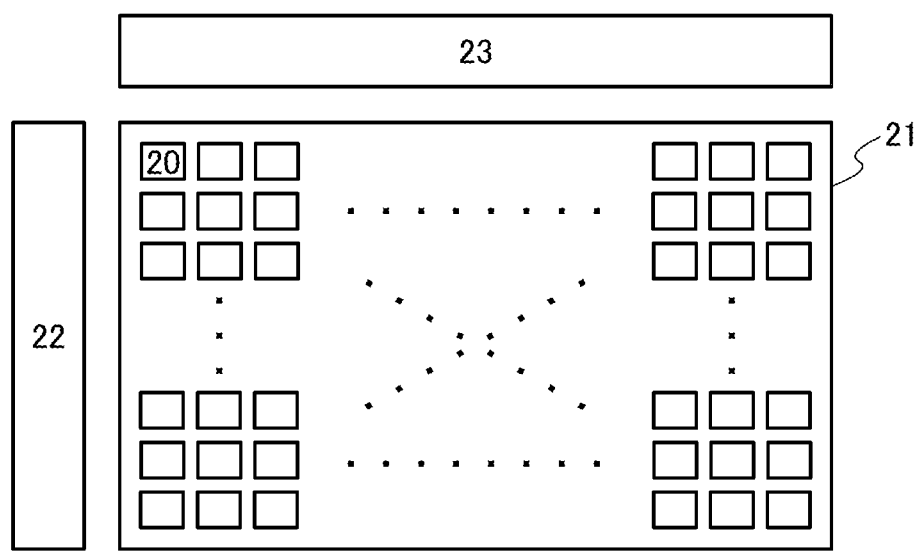
FIG. 5 illustrates a structural example of a memory device.

FIG. 5 illustrates an example of a memory device having the memory element. A memory device illustrated in FIG. 5 includes the memory element array 21 in which a plurality of memory elements 20 are provided in a matrix and the driver circuits 22 and 23 capable of performing selective writing and reading of data on the plurality of memory elements 20.

(2) Application Example 2

FIGS. 6A and 6B, FIGS. 7A and 7B, and FIG. 8 illustrate an example of a programmable logic device having the memory element.

Figure 6A:
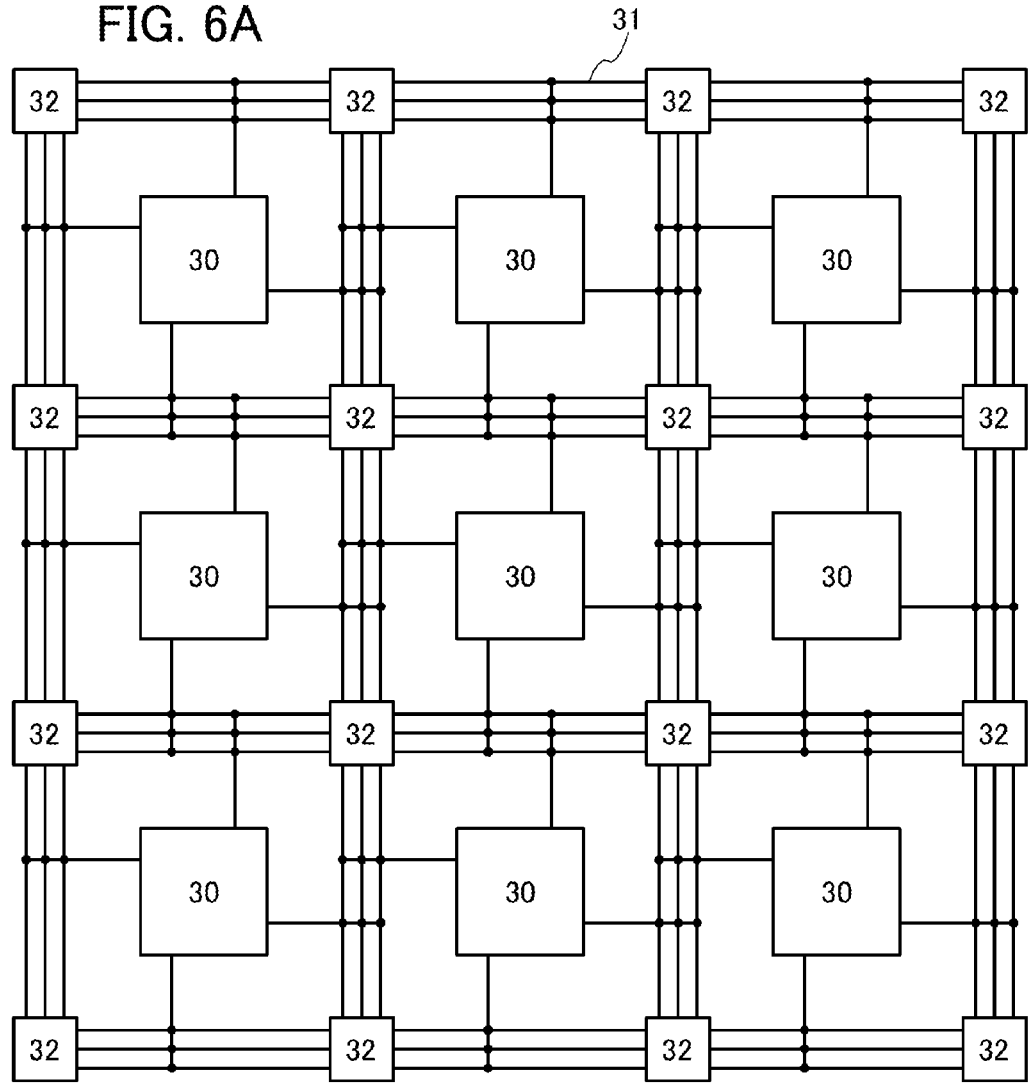
FIG. 6A illustrates a structural example of a programmable logic device and FIG. 6B illustrates a structural example of a switch matrix.

The programmable logic device illustrated in FIG. 6A includes a plurality of logic blocks 30 each including a plurality of logic circuits, a plurality of wirings 31 electrically connected to the plurality of logic blocks 30, and switch matrixes 32 each provided at an intersection of the plurality of wirings 31. The plurality of logic blocks 30 are preferably arranged in matrix as illustrated in FIG. 6A. At least one wiring 31 is provided between the logic blocks 30 and extends in a row direction or in a column direction. Further, each of the switch matrixes 32 is provided at the intersection of the plurality of wirings 31 extending in the row direction and the plurality of wirings 31 extending in the column direction. As illustrated in FIG. 6A, the plurality of wirings 31 and the plurality of switch matrixes 32 are provided so as to surround the peripheral portions of the plurality of logic blocks 30.

Note that the logic blocks 30 are not necessarily arranged in matrix with intervals. For example, the logic blocks 30 may be provided adjacent to each other in the row direction or in the column direction without wiring 31 therebetween. In that case, at least one wiring 31 is provided between groups of logic blocks adjacent to each other in the row direction or in the column direction. Each of the switch matrixes 32 is provided at the intersection of the plurality of wirings 31 extending in the row direction and the plurality of wirings 31 extending in the column direction. The plurality of wirings 31 and the plurality of switch matrixes 32 may be provided so as to surround the peripheral portion of the plurality of logic blocks 30. Any logic circuit can be used as a logic circuit included in the logic block 30. For example, a logic gate may be used, or a logic circuit in which logic gates are combined may be used.

The number of the logic blocks 30, the number of the wirings 31, and the number of the switch matrixes 32 are set as appropriate, and are not limited to the numbers in FIG. 6A.

The programmable logic device may further include a multiplier, a random access memory (RAM) block, a phase-locked loop (PLL) block, or an input/output (I/O) element. The multiplier has a function of multiplying plural pieces of data at high speed. The RAM block has a function of storing given data as a memory. The PLL block has a function of supplying a clock signal to a circuit in the programmable logic device. The I/O element has a function of controlling signal passing between the programmable logic device and an external circuit.

The logic block 30 includes a plurality of logic circuits. A desired logic circuit selected from the plurality of logic circuits are connected, so that a logic circuit having a desired logic function can be formed. Such a logic block 30 can be obtained in such a manner that a plurality of logic circuits are connected via a switch which performs switching of connection in accordance with stored data.

Alternatively, the above logic block 30 can be formed using a look-up table including a plurality of logic circuits. In response to an input signal, the look-up table can perform arithmetic processing in accordance with data stored in a memory provided in each logic block to output an output signal.

The logic block 30 may include a sequential circuit such as a flip flop or a counter circuit; for example, a shift register may be provided.

Figure 6B:
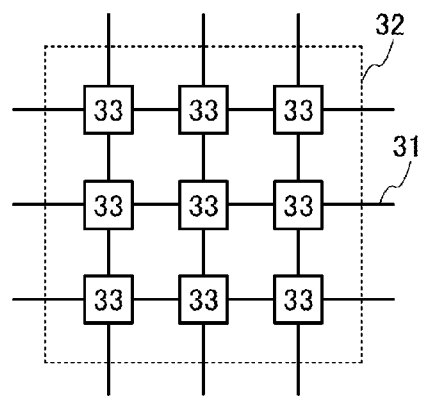

FIG. 6B illustrates a structure of one of the switch matrixes 32 in FIG. 6A. As illustrated in FIG. 6B, the switch matrix 32 includes wiring selection circuits 33 each at an intersection of one of the plurality of wirings 31 extending in the row direction and one of the plurality of wirings 31 extending in the column direction.

FIG. 7A illustrates a structure of the wiring selection circuit 33 in FIG. 6B. The wiring selection circuit 33 includes wirings 31a to 31d and programmable switches 40a to 40f. The wiring 31a is electrically connected to the wiring 31b through the programmable switch 40a, to the wiring 31c through the programmable switch 40e, and to the wiring 31d through the programmable switch 40d. The wiring 31b is electrically connected to the wiring 31c through the programmable switch 40b and to the wiring 31d through the programmable switch 40f. The wiring 31c is electrically connected to the wiring 31d through the programmable switch 40c.

The wiring 31a and the wiring 31c correspond to the wirings 31 which extend in the row direction as shown in FIGS. 6A and 6B, and each of the wiring 31a and wiring 31c can branch in another direction in the wiring selection circuit 33. For example, as illustrated in FIG. 7A, the wiring 31a extending in the row direction can be electrically connected to the wirings 31b and 31d by the programmable switches 40a and 40d to branch in the column direction. Similarly, the wiring 31b and the wiring 31d corresponding to the wirings 31 which extend in the column direction as shown in FIGS. 1A and 1B can also branch in the row direction by the programmable switches 40a to 40d of the wiring selection circuit 33.

Although four wirings (wirings 31a to 31d) are provided in the wiring selection circuit 33 in FIG. 7A, the structure of the wiring selection circuit 33 described in this embodiment is not limited to the above structure. The number of wirings provided in a wiring selection circuit depends on the number of wirings provided in a programmable logic device; therefore, two or more wirings are provided as appropriate and the programmable switches are provided in accordance with the number of the wirings.

Here, each of the programmable switches 40a to 40f controls connection of two of the wirings 31a to 31d in accordance with stored data (also referred to as configuration data).

Thus, in the wiring selection circuit 33, on and off of the programmable switches 40a to 40f are changed, so that a desired connection relation of the wirings 31a to 31d can be obtained.

In other words, in the wiring selection circuit 33 provided at the intersection of the wirings 31 in the switch matrix 32, on and off of the programmable switches are changed, so that desired logic blocks 30 of the plurality of logic blocks 30 can be selectively connected. Thus, a programmable logic device having a desired logic function can be formed. The switch matrix 32 provided in this manner allows two desired logic blocks 30 to be directly connected to each other without another logic block 30 provided therebetween.

In addition, the memory element can be used as the programmable switches 40a to 40f illustrated in FIG. 7A. In FIG. 7B, the memory element illustrated in FIG. 2A is used as the programmable switch 40f illustrated in FIG. 7A. In the programmable switch 40f (memory element) illustrated in FIG. 7B, the one of the source and the drain of the transistor 4 is electrically connected to the wiring 31d and the other of the source and the drain of the transistor 4 is electrically connected to the wiring 31b. In other words, the structure is formed by replacing the wiring 8 in FIG. 2A with the wiring 31d and the wiring 9 in FIG. 2A with the wiring 31b. In the programmable switch 40f (memory element) in FIG. 7B, configuration data can be stored in the node A. That is, the switching of the transistor 4 is controlled in accordance with configuration data. Specifically, whether the wiring 31b and the wiring 31d are electrically connected to each other can be decided in accordance with configuration data.

Note that the memory element illustrated in FIGS. 2B, 2D and FIG. 3 can be used as the programmable switch 40f illustrated in FIG. 7A.

Figure 8:
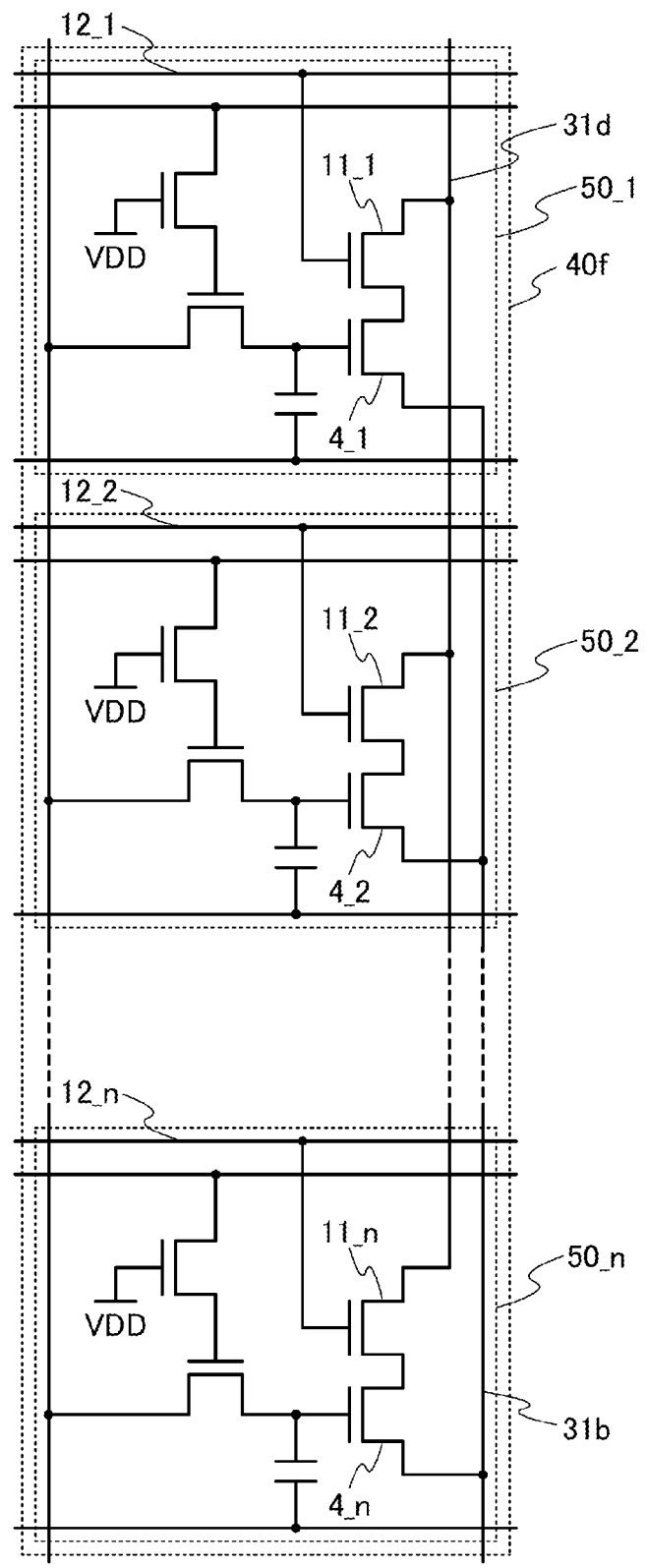
FIG. 8 illustrates a structural example of a programmable switch.

In addition, a circuit illustrated in FIG. 8 can be used as the programmable switch 40f illustrated in FIG. 7A. The circuit illustrated in FIG. 8 is formed using a plurality of memory elements illustrated in FIG. 2D. Specifically, in the circuit illustrated in FIG. 8, the one of the source and the drain of each of the transistors 4_1 to 4_n in the respective memory elements 50_1 to 50_n is electrically connected to the wiring 31b, and the one of the source and the drain of each of the transistors 11_1 to 11_n in the respective memory elements 50_1 to 50_n is electrically connected to the wiring 31d. In addition, in the circuit illustrated in FIG. 8, whether the wirings 31b and 31d are electrically connected to each other can be decided by using configuration data stored in any one of the memory elements 50_1 to 50_n. Specifically, the high power source potential (VDD) may be supplied to any one of the wirings 12_1 to 12_n and the low power source potential (VSS) may be supplied to the others.

In the circuit illustrated in FIG. 8, whether predetermined two logic blocks are connected to each other can be decided by selecting any one of a plurality of configuration data stored in advance. In addition, at least one of the plurality of not-selected configuration data can be rewritten as appropriate. Therefore, in the circuit illustrated in FIG. 8, operation delay can be reduced in comparison with the case where configuration data is rewritten when new configuration data is needed.

Example of Transistor Channel of which is formed in Oxide Semiconductor Layer

Figure 9:
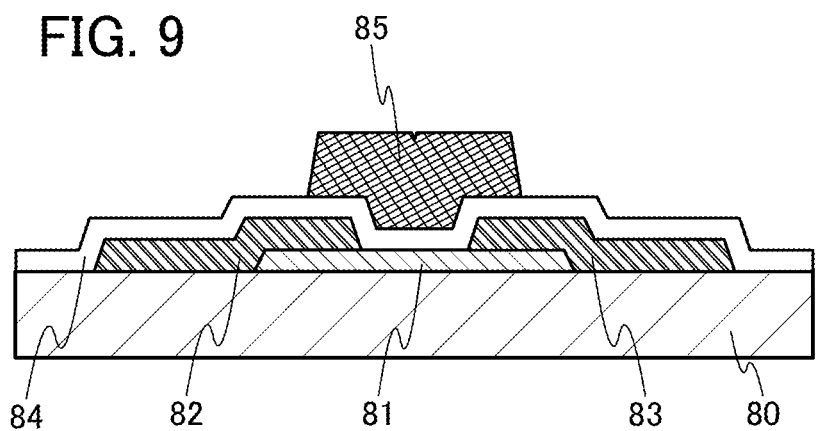
FIG. 9 illustrates a structural example of a transistor.

FIG. 9 illustrates a structural example of a transistor a channel of which is formed in an oxide semiconductor layer. A transistor illustrated in FIG. 9 includes an oxide semiconductor layer 81 provided over a layer 80 which has an insulating surface, a conductive layer 82 in contact with one end of the oxide semiconductor layer 81, a conductive layer 83 in contact with the other end of the oxide semiconductor layer 81, an insulating layer 84 provided over the oxide semiconductor layer 81, the conductive layer 82, and the conductive layer 83, and a conductive layer 85 provided over the insulating layer 84. Note that in the transistor illustrated in FIG. 9, the conductive layers 82 and 83 function as a source and a drain, the insulating layer 84 functions as a gate insulating film, and the conductive layer 85 functions as a gate.

1. Specific Example of Oxide Semiconductor Layer 81

<(1) Oxide Semiconductor Material>

A film containing at least indium can be used as the oxide semiconductor layer 81. In particular, a film containing indium and zinc is preferably used. As a stabilizer for reducing variations in electric characteristics of the transistor, a film containing gallium (Ga) in addition to indium and zinc is preferably used.

Alternatively, a film which contains, as a stabilizer, one or more of tin, hafnium, aluminum, zirconium, and lanthanoid such as lanthanum, cerium, praseodymium, neodymium, samarium, europium, gadolinium, terbium, dysprosium, holmium, erbium, thulium, ytterbium, or lutetium can be used as the oxide semiconductor layer 81.

As the oxide semiconductor layer 81, for example, a film of any of the following oxides can be used: indium oxide; a two-component metal oxide such as an In—Zn-based oxide, an In—Mg-based oxide, or an In—Ga-based oxide; a three-component metal oxide such as an In—Ga—Zn-based oxide, an In—Al—Zn-based oxide, an In—Sn—Zn-based oxide, an In—Hf—Zn-based oxide, an In—La—Zn-based oxide, an In—Ce—Zn-based oxide, an In—Pr—Zn-based oxide, an In—Nd—Zn-based oxide, an In—Sm—Zn-based oxide, an In—Eu—Zn-based oxide, an In—Gd—Zn-based oxide, an In—Tb—Zn-based oxide, an In—Dy—Zn-based oxide, an In—Ho—Zn-based oxide, an In—Er—Zn-based oxide, an In—Tm—Zn-based oxide, an In—Yb—Zn-based oxide, or an In—Lu—Zn-based oxide; and a four-component metal oxide such as an In—Sn—Ga—Zn-based oxide, an In—Hf—Ga—Zn-based oxide, an In—Al—Ga—Zn-based oxide, an In—Sn—Al—Zn-based oxide, an In—Sn—Hf—Zn-based oxide, or an In—Hf—Al—Zn-based oxide.

Here, for example, an "In—Ga—Zn-based oxide" means an oxide containing In, Ga, and Zn as its main components and there is no particular limitation on the ratio of In, Ga, and Zn. The In—Ga—Zn-based oxide may contain a metal element other than the In, Ga, and Zn.

Nitrogen may be substituted for part of constituent oxygen of the oxide semiconductor layer 81.

<(2) Crystal Structure of Oxide Semiconductor>

For the oxide semiconductor layer 81, a film having a single crystal state, a polycrystalline (also referred to as polycrystal) state, an amorphous state, or the like can be used. In addition, a CAAC-OS (c-axis aligned crystalline oxide semiconductor) film can be used for the oxide semiconductor layer 81. The CAAC-OS film is described below The CAAC-OS film is not completely single crystal nor completely amorphous. A crystal part included in the CAAC-OS film fits inside a cube whose one side is less than 100 nm. In an observation image obtained with a transmission electron microscope (TEM), a boundary between crystals in the CAAC-OS film is not clear. Furthermore, with the TEM, a grain boundary in the CAAC-OS film is not found. Thus, in the CAAC-OS film, a reduction in electron mobility, due to the grain boundary, is suppressed.

In each of the crystal parts included in the CAAC-OS film, a c-axis is aligned in a direction parallel to a normal vector of a surface where the CAAC-OS film is formed or a normal vector of a surface of the CAAC-OS film, triangular or hexagonal atomic arrangement which is seen from the direction perpendicular to the a-b plane is formed, and metal atoms are arranged in a layered manner or metal atoms and oxygen atoms are arranged in a layered manner when seen from the direction perpendicular to the c-axis. Note that, among crystal parts, the directions of the a-axis and the b-axis of one crystal part may be different from those of another crystal part. In this specification, a simple term "perpendicular" includes a range from 85° to 95°. In addition, a simple term "parallel" includes a range from −5° to 5°.

In the CAAC-OS film, distribution of crystals is not necessarily uniform. For example, in the formation process of the CAAC-OS film, in the case where crystal growth occurs from a surface side of the oxide semiconductor film, the proportion of crystal parts in the vicinity of the surface of the oxide semiconductor film is higher than that in the vicinity of the surface where the oxide semiconductor film is formed in some cases.

Since the c-axes of the crystalline portions included in the CAAC-OS film are aligned in the direction parallel to a normal vector of a surface where the CAAC-OS film is formed or a normal vector of a surface of the CAAC-OS film, the directions of the c-axes may be different from each other depending on the shape of the CAAC-OS film (the cross-sectional shape of the surface where the CAAC-OS film is formed or the cross-sectional shape of the surface of the CAAC-OS film). Note that when the CAAC-OS film is formed, the direction of c-axis of the crystal part is the direction parallel to a normal vector of the surface where the CAAC-OS film is formed or a normal vector of the surface of the CAAC-OS film. The crystal part is formed by film formation or by performing treatment for crystallization such as heat treatment after film formation.

With the use of the CAAC-OS film in a transistor, change in electric characteristics of the transistor due to irradiation with visible light or ultraviolet light is small. Thus, the transistor has high reliability.

<(3) Layer Structure of Oxide Semiconductor>

As the oxide semiconductor layer 81, a single-layer oxide semiconductor film or a layer formed of a stack having plural kinds of oxide semiconductor films may be used. For example, a layer including at least two of an amorphous oxide semiconductor film, a polycrystalline oxide semiconductor film, and a CAAC-OS film can be used for the oxide semiconductor layer 81.

Alternatively, a layer formed of a stack of oxide semiconductor films having different compositions can be used as the oxide semiconductor layer 81. Specifically, a layer including a first oxide semiconductor film (hereinafter also referred to as an upper layer) which is provided on the insulating layer 84 side and a second oxide semiconductor film (hereinafter also referred to as a lower layer) which is provided on the insulating surface layer 80 side and has a different composition from the first oxide semiconductor film can be used as the oxide semiconductor layer 81.

2. Specific Example of Conductive Layers 82 and 83

For the conductive layers 82 and 83, a film containing an element selected from aluminum, copper, titanium, tantalum, tungsten, molybdenum, chromium, neodymium, and scandium; a film of an alloy containing any of these elements; a film of a nitride containing any of these elements; or the like can be used. Alternatively, the gate layer 1 can be formed with a stack of these films.

3. Specific Example of the Insulating Layer 84

The insulating layer 84 can be formed using an inorganic insulating material film such as a silicon oxide film, a silicon nitride film, a silicon oxynitride film, a silicon nitride oxide film, an aluminum oxide film, an aluminum oxynitride film, or a gallium oxide film. Alternatively, a stack of layers of these materials can be also used. Note that an aluminum oxide film is preferably used for the insulating layer 84. An aluminum oxide film has a high shielding (blocking) effect of preventing penetration of oxygen and an impurity such as hydrogen. Therefore, when a layer including the aluminum oxide film is used as the insulating layer 84, it is possible to prevent release of oxygen from the oxide semiconductor layer 81 and entry of impurities such as hydrogen to the oxide semiconductor layer 81.

The insulating layer 84 can be formed using a film including a hafnium oxide film, a yttrium oxide film, a hafnium silicate ($HfSi_xO_y$ (x>0, y>0)) film, a hafnium silicate film to which nitrogen is added, a hafnium aluminate ($HfAl_xO_y$ (x>0, y>0)) film, or a lanthanum oxide film (i.e., a film formed of what is called a high-k material). By using such a film, gate leakage current can be reduced.

4. Specific Example of Conductive Layer 85

The conductive layer 85 can be formed using a film containing an element selected from aluminum, copper, titanium, tantalum, tungsten, molybdenum, chrome, neodymium, and scandium or a film of an alloy containing any of these elements as its component. Alternatively, the conductive layer 85 can be formed using a metal oxide containing nitrogen, specifically, an In—Ga—Zn—O film containing nitrogen, an In—Sn—O film containing nitrogen, an In—Ga—O film containing nitrogen, an In—Zn—O film containing nitrogen, a Sn—O film containing nitrogen, an In—O film containing nitrogen, or a metal nitride (e.g., InN or SnN) film. Such a nitride film has a work function of higher than or equal to 5 eV (electron volts), preferably higher than or equal to 5.5 eV (electron volts), which enables the threshold voltage of the transistor to be positive when such a nitride film is used as the gate, so that what is called a normally-off switching element can be achieved. Alternatively, the conductive layer 85 can be formed with a stack of these films.

5. Supplementary Note

In the transistor illustrated in FIG. 9, it is preferred to suppress entry of impurities into the oxide semiconductor layer 81 and release of constituent element of the oxide semiconductor layer 81. This is because the electrical characteristics of the transistor 1 are changed when such a phenomenon occurs. As a means for suppressing this phenomenon, insulating layers having a high blocking effect are provided above and below the transistor 1 (between the layer 80 which has an insulating surface and the transistor, and over the insulating layer 84 and the conductive layer 85). For example, the insulating layer can be formed using an inorganic insulating material film such as a silicon oxide film, a silicon nitride film, a silicon oxynitride film, a silicon nitride oxide film, an aluminum oxide film, an aluminum oxynitride film, or a gallium oxide film. Alternatively, a stack of layers of these materials can be also used.

Example 1

In this example, a structural example of a memory element which includes a transistor 902 a channel of which is formed in an oxide semiconductor layer and a transistor 901a channel of which is formed in a single crystal silicon wafer, and an example of a method for manufacturing the memory element will be described with reference to FIG. 10. Note that for example, the transistor 902 can be used as the transistor 1 illustrated in FIG. 1A, FIGS. 2A to 2D and FIG. 3 and the transistor 901 can be used as the transistor 4 illustrated in FIGS. 2A to 2D and FIG. 3.

Note that the transistor 901 may be formed using a semiconductor material such as germanium, silicon germanium, or single crystal silicon carbide as well as silicon. For example, the transistor including silicon can be formed using a silicon thin film which is formed by an SOI method, a silicon thin film which is formed by a vapor deposition method, or the like. In that case, a glass substrate formed by a fusion process or a float process, a quartz substrate, a semiconductor substrate, a ceramic substrate, or the like can be used as a substrate. In the case where the temperature of heat treatment to be performed later is high, use of a glass substrate whose strain point is higher than or equal to 730° C. is favorable.

Figure 10:
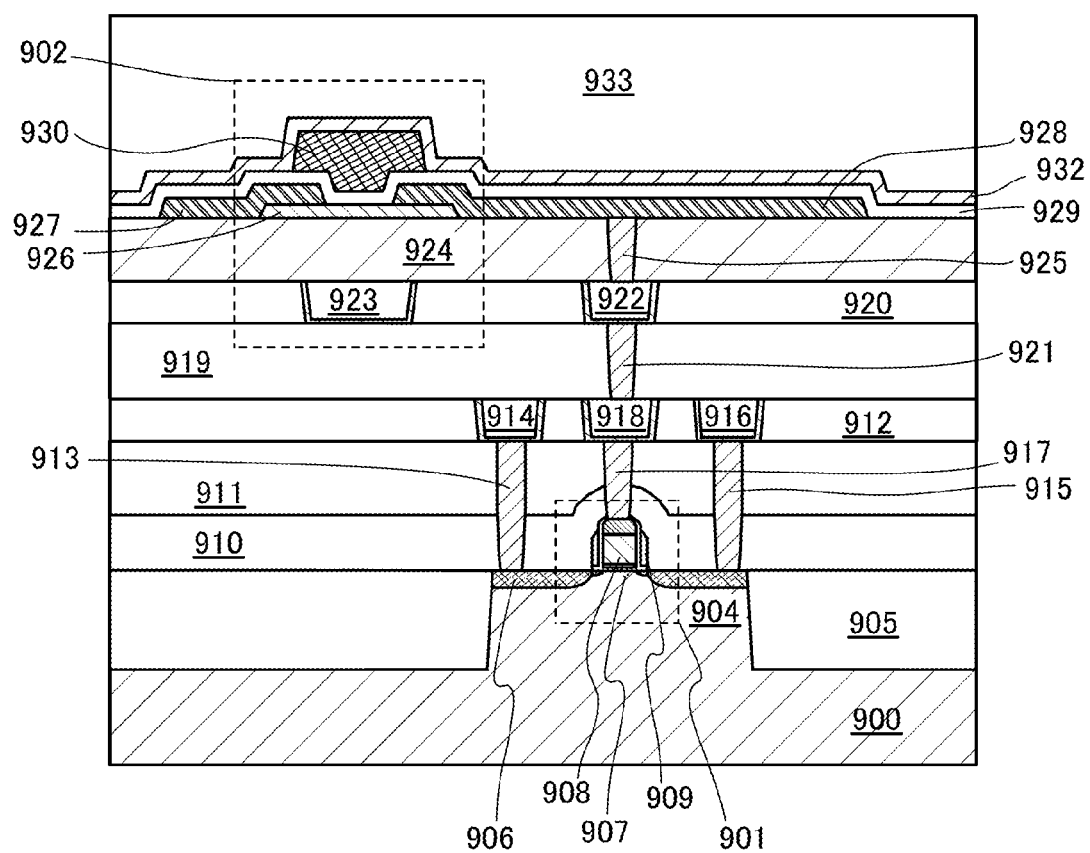
FIG. 10 illustrates a structural example of a memory element.

In a memory element illustrated in FIG. 10, the transistor 901 including a single crystal silicon wafer is formed, and the transistor 902 including an oxide semiconductor is formed in a level higher than the level of the transistor 901. In other words, the memory element described in this example is a memory element that has a three-dimensional stacked-layer structure in which a silicon wafer is used as a substrate and a transistor layer is provided above the silicon wafer. Moreover, the memory element described in this example is a hybrid memory element including a transistor in which silicon is used for a channel formation region and a transistor in which an oxide semiconductor is used for a channel formation region.

Either an n-channel transistor (NMOSFET) or a p-channel transistor (PMOSFET) can be used as the transistor 901 formed using a substrate 900 containing a semiconductor material. In the example shown in FIG. 10, the transistor 901 is electrically isolated from other elements by a shallow trench isolation (STI) 905. The use of the STI 905 can reduce generation of a bird's beak, which is caused by a LOCOS element isolation method, in an element isolation region, and can reduce the size of the element isolation region. On the other hand, in a semiconductor device that is not required to be structurally miniaturized or downsized, the STI 905 is not necessarily formed and an element isolation means such as LOCOS can be used. In the substrate 900 where the transistor 901 is formed, a well 904 to which an impurity imparting conductivity, such as boron, phosphorus, or arsenic, is added is formed.

The transistor 901 in FIG. 10 includes a channel formation region in the substrate 900, impurity regions 906 (also referred to as a source region and a drain region) provided such that the channel formation region is provided therebetween, a gate insulating film 907 over the channel formation region, and a gate electrode layer 908 over the gate insulating film 907 to overlap with the channel formation region. The gate electrode layer 908 can have a stacked-layer structure of a gate electrode layer including a first material for increasing processing accuracy and a gate electrode layer including a second material for reducing the resistance to be used as a wiring. For example, the gate electrode layer 908 can have a stacked-layer structure of nickel silicide and crystalline silicon to which an impurity imparting conductivity, such as phosphorus, is added. Note that the structure is not limited thereto, and materials, the number of stacked layers, the shape, or the like can be adjusted as appropriate depending on required specifications.

Note that the transistor 901 illustrated in FIG. 10 may be a fin-type transistor. In a fin-type structure, part of a semiconductor substrate is processed into a plate-shaped protrusion, and a gate electrode layer is provided to cross the protrusion in the longitudinal direction. The gate electrode layer covers an upper surface and side surfaces of the protrusion with a gate insulating film provided between the gate electrode layer and the protrusion. With the transistor 901 having a fin-type structure, the channel width can be reduced to achieve higher integration of the transistor 901. Further, a larger amount of current can flow through the transistor 901 and the control efficiency can be increased, so that the off-state current and threshold voltage of the transistor 901 can be reduced.

Contact plugs 913 and 915 are connected to the impurity regions 906 in the substrate 900. Here, the contact plugs 913 and 915 also function as a source electrode and a drain electrode of the transistor 901 to which the contact plugs 913 and 915 are connected. In addition, impurity regions that are different from the impurity regions 906 are provided between the impurity regions 906 and the channel formation region. These impurity regions function as LDD regions or extension regions for controlling the distribution of an electric field in the vicinity of the channel formation region, depending on the concentration of an impurity introduced thereto. Sidewall insulating films 909 are provided at side surfaces of the gate electrode layer 908 with an insulating film provided therebetween. By using this insulating film and the sidewall insulating films 909, the LDD regions or extension regions can be formed.

The transistor 901 is covered with an insulating film 910. The insulating film 910 can function as a protective film and can prevent impurities from entering the channel formation region from the outside. With the insulating film 910 formed by a CVD method with a material such as silicon nitride, hydrogenation can be performed by heat treatment in the case of using single crystal silicon for the channel formation region. Stress can be applied to the semiconductor material used for the channel formation region in such a manner that an insulating film having tensile stress or compressive stress is used as the insulating film 910. By application of tensile stress to a silicon material used for the channel formation region of an n-channel transistor or application of compressive stress to a silicon material used for the channel formation region of a p-channel transistor, the field-effect mobility of the transistor can be increased.

An insulating film 911 is provided over the insulating film 910, and the surface of the insulating film 911 is planarized by CMP. Accordingly, element layers in levels higher than the level including the transistor 901 can be stacked with high accuracy.

A level including the transistor 902 whose channel is formed in the oxide semiconductor layer is formed above the level including the transistor 901. The transistor 902 is a top-gate transistor and includes a source electrode layer 927 and a drain electrode layer 928 in contact with side surfaces and an upper surface of an oxide semiconductor film 926, and a gate electrode layer 930 over a gate insulating film 929 over the oxide semiconductor film 926 and the source electrode layer 927 and drain electrode layer 928. An insulating film 932 and an insulating film 933 are formed to cover the transistor 902. Here, a fabrication method of the transistor 902 is described below.

The oxide semiconductor film 926 is formed over an insulating film 924. The insulating film 924 can be formed using an inorganic insulating film of silicon oxide, silicon nitride, silicon nitride oxide, silicon oxynitride, aluminum oxide, aluminum nitride, aluminum nitride oxide, or the like. The insulating film 924 is particularly preferred to be formed using a material with a low dielectric constant (a low-k material) because capacitance due to overlap of electrodes or wirings can be sufficiently reduced. Note that the insulating film 924 may be a porous insulating film containing any of the above materials. Since the porous insulating film has lower dielectric constant than an insulating film with high density, parasitic capacitance due to electrodes or wirings can be further reduced. In this example, the insulating film 924 is a stack of a silicon oxide film with a thickness of about 300 nm on a 50-nm-thick aluminum oxide film.

The oxide semiconductor film 926 can be formed by processing an oxide semiconductor film formed over the insulating film 924 into a desired shape. The thickness of the oxide semiconductor film is larger than or equal to 2 nm and smaller than or equal to 200 nm, preferably larger than or equal to 3 nm and smaller than or equal to 50 nm, more preferably larger than or equal to 3 nm and smaller than or equal to 20 nm. The oxide semiconductor film is formed by a sputtering method using an oxide semiconductor target. Moreover, the oxide semiconductor film can be formed by a sputtering method under a rare gas (e.g., argon) atmosphere, an oxygen atmosphere, or a mixed atmosphere of a rare gas (e.g., argon) and oxygen.

Note that before the oxide semiconductor film is deposited by a sputtering method, dust on the surface of the insulating film 924 is preferred to be removed by reverse sputtering in which an argon gas is introduced and plasma is generated. The reverse sputtering refers to a method in which, without application of voltage to the target side, an RF power source is used for application of voltage to a substrate side in an argon atmosphere to generate plasma in the vicinity of the substrate to modify the surface of the insulating film 924. Note that instead of an argon atmosphere, a nitrogen atmosphere, a helium atmosphere, or the like may be used. Alternatively, an argon atmosphere to which oxygen, nitrous oxide, or the like is added may be used. Further alternatively, an argon atmosphere to which chlorine, carbon tetrafluoride, or the like is added may be used.

In this example, as the oxide semiconductor film, a 30-nm-thick In—Ga—Zn-based oxide semiconductor thin film, which is obtained by a sputtering method using a target including indium (In), gallium (Ga), and zinc (Zn), is used. As the above target, it is preferred to use a target containing In, Ga, and Zn at an atomic ratio of 1:1:1, 4:2:3, 3:1:2, 1:1:2, 2:1:3, or 3:1:4. The filling factor of the target including In, Ga, and Zn is higher than or equal to 90% and lower than or equal to 100%, preferably higher than or equal to 95% and lower than 100%. With the use of the target with high filling rate, a dense oxide semiconductor film is deposited.

In the case of using an In—Zn-based material for the oxide semiconductor film, a target containing In and Zn at an atomic ratio of 50:1 to 1:2 ($In_2O_3$:ZnO=25:1 to 1:4 in a molar ratio), preferably In and Zn at an atomic ratio of 20:1 to 1:1 ($In_2O_3$:ZnO=10:1 to 1:2 in a molar ratio), more preferably In and Zn at an atomic ratio of 15:1 to 1.5:1 at an atomic ratio ($In_2O_3$:ZnO=15:2 to 3:4 in a molar ratio) is to be used. For example, in a target used for formation of an In—Zn-based oxide semiconductor containing In, Zn, and O at an atomic ratio of X:Y:Z, the relation of $Z>1.5X+Y$ is satisfied. The mobility can be improved by keeping the ratio of Zn within the above range.

In the case of forming an In—Sn—Zn-based oxide semiconductor film as the oxide semiconductor film by a sputtering method, it is preferred to use an In—Sn—Zn—O target containing In, Sn, and Zn at an atomic ratio of 1:1:1, 2:1:3, 1:2:2, or 20:45:35.

In this example, the oxide semiconductor film is formed in such a manner that the substrate is stored in a treatment chamber kept at reduced pressure, a sputtering gas from which hydrogen and moisture have been removed is introduced to the treatment chamber while moisture remaining therein is removed, and the above-described target is used. The substrate temperature may be higher than or equal to 100° C. and lower than or equal to 600° C., preferably higher than or equal to 200° C. and lower than or equal to 400° C. during film formation. By forming the oxide semiconductor film in a state where the substrate is heated, the impurity concentration in the formed oxide semiconductor film can be reduced. In addition, damage due to sputtering can be reduced. In order to remove moisture remaining in the treatment chamber, an entrapment vacuum pump is preferred to be used. For example, a cryopump, an ion pump, or a titanium sublimation pump is preferred to be used. The evacuation unit may be a turbo pump provided with a cold trap. In the treatment chamber which is evacuated with the cryopump, for example, a hydrogen atom, a compound containing a hydrogen atom, such as water ($H_2O$), and the like are evacuated, whereby the impurity concentration in the oxide semiconductor film formed in the treatment chamber can be reduced.

As one example of the deposition conditions, the distance between the substrate and the target is 100 mm, the pressure is 0.6 Pa, the direct-current (DC) power source is 0.5 kW, and the atmosphere is an oxygen atmosphere (the proportion of the oxygen flow rate is 100%). Note that a pulsed direct-current (DC) power source is preferred because dust generated in deposition can be reduced and the film thickness can be made uniform.

Moreover, when the leakage rate of the treatment chamber of the sputtering apparatus is set to be lower than or equal to $1\times10^{-10}$ Pa·m$^3$/second, entry of impurities such as an alkali metal or hydride into the oxide semiconductor film that is being formed by a sputtering method can be reduced. Further, with the use of the entrapment vacuum pump as the evacuation unit, counter flow of impurities such as an alkali metal, a hydrogen atom, a hydrogen molecule, water, or hydride from the evacuation unit can be reduced.

When the purity of the target is set to be higher than or equal to 99.99%, an alkali metal, a hydrogen atom, a hydrogen molecule, water, a hydroxyl group, hydride, or the like entering the oxide semiconductor film can be reduced. In addition, when the target is used, the concentration of an alkali metal such as lithium, sodium, or potassium can be reduced in the oxide semiconductor film.

In order that the oxide semiconductor film does not contain hydrogen, a hydroxyl group, and moisture as much as possible, it is preferred that impurities such as moisture or hydrogen that are adsorbed on the substrate 900 be eliminated and evacuated by preheating the substrate 900 over which the films and the like including the insulating film 924 are formed in a preheating chamber of the sputtering apparatus, as pretreatment for deposition. The temperature for the preheating is higher than or equal to 100° C. and lower than or equal to 400° C., preferably higher than or equal to 150° C. and lower than or equal to 300° C. As an evacuation unit, a cryopump is preferred to be provided in the preheating chamber. Note that this preheating treatment can be omitted.

Note that etching for forming the oxide semiconductor film 926 may be dry etching, wet etching, or both dry etching and wet etching. As an etching gas used for dry etching, a gas containing chlorine (a chlorine-based gas such as chlorine ($Cl_2$), boron trichloride ($BCl_3$), silicon tetrachloride ($SiCl_4$), or carbon tetrachloride ($CCl_4$)) is preferred to be used. Alternatively, a gas containing fluorine (a fluorine-based gas such as carbon tetrafluoride ($CF_4$), sulfur hexafluoride ($SF_6$), nitrogen trifluoride ($NF_3$), or trifluoromethane ($CHF_3$)), hydrogen bromide (HBr), oxygen ($O_2$), any of these gases to which a rare gas such as helium (He) or argon (Ar) is added, or the like can be used.

As the dry etching method, a parallel plate reactive ion etching (RIE) method or an inductively coupled plasma (ICP) etching method can be used. In order to etch the film to have a desired shape, the etching conditions (e.g., the amount of electric power applied to a coiled electrode, the amount of electric power applied to an electrode on the substrate side, and the electrode temperature on the substrate side) are adjusted as appropriate.

A resist mask used for forming the oxide semiconductor film 926 may be formed by an inkjet method. Formation of the resist mask by an inkjet method needs no photomask; thus, manufacturing cost can be reduced.

Note that it is preferred that reverse sputtering be performed before the formation of a conductive film in a subsequent step so that a resist residue and the like that are attached onto the surfaces of the oxide semiconductor film 926 and the insulating film 924 are removed.

Note that the oxide semiconductor film deposited by sputtering or the like contains in some cases a large amount of moisture or hydrogen (including a hydroxyl group) as impurities. Moisture or hydrogen easily forms donor levels and thus serves as an impurity in the oxide semiconductor. In this example, in order to reduce impurities such as moisture or hydrogen in the oxide semiconductor film 926 (in order to perform dehydration or dehydrogenation), the oxide semiconductor film 926 is subjected to heat treatment in a reduced-pressure atmosphere, an inert gas atmosphere of nitrogen, a rare gas, or the like, an oxygen gas atmosphere, or ultra-dry air (the moisture amount is less than or equal to 20 ppm (−55° C. by conversion into a dew point), preferably less than or equal to 1 ppm, more preferably less than or equal to 10 ppb in the case where measurement is performed by a dew point meter in a cavity ring-down laser spectroscopy (CRDS) method).

By performing the heat treatment on the oxide semiconductor film 926, moisture or hydrogen in the oxide semiconductor film 926 can be released. Specifically, the heat treatment may be performed at a temperature higher than or equal to 250° C. and lower than or equal to 750° C., preferably higher than or equal to 400° C. and lower than the strain point of the substrate. For example, it is favorable to perform the heat treatment at 500° C. for about three minutes to six minutes. When a rapid thermal anneal (RTA) method is used for the heat treatment, dehydration or dehydrogenation can be performed in a short time; thus, the treatment can be performed even at a temperature higher than the strain point of a glass substrate.

In this example, an electrical furnace that is one of heat treatment apparatuses is used.

Note that the heat treatment apparatus is not limited to an electric furnace, and may have a device for heating an object to be processed by heat conduction or heat radiation from a heating element such as a resistance heating element. For example, an RTA apparatus such as a gas rapid thermal anneal (GRTA) apparatus or a lamp rapid thermal anneal (LRTA) apparatus can be used. The LRTA apparatus is an apparatus for heating an object to be processed by radiation of light (an electromagnetic wave) emitted from a lamp such as a halogen lamp, a metal halide lamp, a xenon arc lamp, a carbon arc lamp, a high pressure sodium lamp, or a high pressure mercury lamp. The GRTA apparatus is an apparatus for heat treatment using a high-temperature gas. As the gas, an inert gas which does not react with an object to be processed by heat treatment, like nitrogen or a rare gas such as argon, is used.

In the heat treatment, it is preferred that moisture, hydrogen, or the like be not contained in nitrogen or a rare gas such as helium, neon, or argon. Alternatively, the purity of nitrogen or a rare gas such as helium, neon, or argon which is introduced to the heat treatment apparatus is preferably greater than or equal to 6 N (99.9999%), more preferably greater than or equal to 7 N (99.99999%) (i.e., the impurity concentration is less than or equal to 1 ppm, preferably less than or equal to 0.1 ppm).

Through the above process, the concentration of hydrogen in the oxide semiconductor film 926 can be reduced and the oxide semiconductor film can be highly purified. Accordingly, the oxide semiconductor film can be stabilized. In addition, a transistor with high withstand voltage and an extremely small off-state current can be fabricated by using the oxide semiconductor film in which the hydrogen concentration is reduced and the purity is improved. The above heat treatment can be performed at any time after the oxide semiconductor film is formed.

Next, the source electrode layer 927 and drain electrode layer 928 are formed through a photolithography process. Specifically, the source electrode layer 927 and drain electrode layer 928 can be formed in such a manner that the conductive film is formed over the insulating film 924 by a sputtering method or a vacuum evaporation method and then processed (patterned) into a predetermined shape.

In this example, a 100-nm-thick tungsten film is used for the source electrode layer 927 and drain electrode layer 928.

Note that the materials and etching conditions are adjusted as appropriate so that the oxide semiconductor film 926 is not removed as much as possible in etching of the conductive film. Depending on the etching conditions, an exposed portion of the oxide semiconductor film 926 is partly etched and thus a groove (a recessed portion) is formed in some cases.

Since the tungsten film is used as the conductive film to be the source electrode layer 927 and drain electrode layer 928 in this example, wet etching can be selectively performed on the conductive film using a solution (an ammonia hydrogen peroxide mixture) containing ammonia and hydrogen peroxide water. As the ammonia hydrogen peroxide mixture, specifically, a solution in which hydrogen peroxide water of 31 wt %, ammonia water of 28 wt %, and water are mixed at a volume ratio of 5:2:2 is used. Alternatively, dry etching may be performed on the conductive film with the use of a gas containing carbon tetrafluoride ($CF_4$), chlorine ($Cl_2$), or oxygen.

In order to reduce the numbers of photomasks and steps in the photolithography process, etching may be performed with the use of a resist mask formed using a multi-tone mask through which light is transmitted so as to have a plurality of intensities. The resist mask formed using a multi-tone mask has a plurality of thicknesses and can be changed in shape by ashing; thus, the resist mask can be used in a plurality of etching steps for processing films into different patterns. In other words, a resist mask corresponding to at least two kinds of different patterns can be formed by one multi-tone mask. Thus, the number of light-exposure masks can be reduced and the number of corresponding photolithography processes can be also reduced, whereby the process can be simplified.

Further, an oxide conductive film functioning as a source region and a drain region may be provided between the oxide semiconductor film 926 and the source electrode layer 927 and drain electrode layer 928. The material of the oxide conductive film is preferred to contain a zinc oxide as a component and is preferred not to contain an indium oxide. For such an oxide conductive film, a zinc oxide, a zinc aluminum oxide, a zinc aluminum oxynitride, a gallium zinc oxide, or the like can be used.

For example, in the case where the oxide conductive film is formed, patterning for forming the oxide conductive film and patterning for forming the source electrode layer 927 and drain electrode layer 928 may be performed concurrently.

By providing the oxide conductive film functioning as the source region and the drain region, the resistances between the oxide semiconductor film 926 and the source electrode layer 927 and drain electrode layer 928 can be reduced, so that the transistor 902 can operate at a high speed. In addition, with the oxide conductive film functioning as the source region and the drain region, the withstand voltage of the transistor can be increased.

Next, plasma treatment using a gas such as $N_2O$, $N_2$, or Ar may be performed. By this plasma treatment, water or the like adhering to an exposed surface of the oxide semiconductor film is removed. Alternatively, plasma treatment using a mixture gas of oxygen and argon may be performed.

After the plasma treatment, the gate insulating film 929 is formed to cover the source electrode layer 927 and drain electrode layer 928 and the oxide semiconductor film 926. Then, the gate electrode layer 930 is formed over the gate insulating film 929 so as to overlap with the oxide semiconductor film 926.

In this example, a 20-nm-thick silicon oxynitride film formed by a sputtering method is used as the gate insulating film 929. The substrate temperature during film formation favorably ranges from room temperature to 400° C., and is 300° C. in this example.

After the gate insulating film 929 is formed, heat treatment may be performed. The heat treatment is performed in a nitrogen atmosphere, ultra-dry air, or a rare gas (e.g., argon or helium) atmosphere preferably at a temperature higher than or equal to 200° C. and lower than or equal to 400° C., for example, higher than or equal to 250° C. and lower than or equal to 350° C. The water content in the gas is preferably lower than or equal to 20 ppm, more preferably lower than or equal to 1 ppm, further preferably lower than or equal to 10 ppb. In this example, for example, the heat treatment is performed at 250° C. in a nitrogen atmosphere for an hour. Alternatively, RTA treatment for a short time at a high temperature may be performed before the formation of the source electrode layer 927 and drain electrode layer 928 in a manner similar to that of the heat treatment performed on the oxide semiconductor film for reduction of moisture or hydrogen. Even when oxygen vacancies are generated in the oxide semiconductor film 926 by the previous heat treatment performed on the oxide semiconductor film 926, oxygen is supplied to the oxide semiconductor film 926 from the gate insulating film 929 by performing the heat treatment after the gate insulating film 929 containing oxygen is provided. By the supply of oxygen to the oxide semiconductor film 926, oxygen vacancies that serve as donors can be reduced in the oxide semiconductor film 926 and the stoichiometric composition can be satisfied. As a result, the oxide semiconductor film 926 can be made substantially i-type and fluctuation in electric characteristics of the transistors due to oxygen vacancies can be reduced, which results in improvement of electrical characteristics. There is no particular limitation on the timing of this heat treatment as long as it is after the formation of the gate insulating film 929. When this heat treatment also serves as heat treatment in another step, the oxide semiconductor film 926 can be made substantially i-type without an increase in the number of steps.

Alternatively, oxygen vacancies that serve as donors in the oxide semiconductor film 926 may be reduced by subjecting the oxide semiconductor film 926 to heat treatment in an oxygen atmosphere so that oxygen is added to the oxide semiconductor film 926. The heat treatment is performed at a temperature higher than or equal to 100° C. and lower than 350° C., preferably higher than or equal to 150° C. and lower than 250° C., for example. It is preferred that an oxygen gas used for the heat treatment under an oxygen atmosphere do not include water, hydrogen, or the like. Alternatively, the purity of the oxygen gas which is introduced to the heat treatment apparatus is preferably greater than or equal to 6N (99.9999%), more preferably greater than or equal to 7N (99.99999%) (i.e., the impurity concentration in the oxygen gas is less than or equal to 1 ppm, preferably less than or equal to 0.1 ppm).

Further alternatively, oxygen may be added to the oxide semiconductor film 926 by an ion implantation method, an ion doping method, or the like to reduce oxygen vacancies that serve as donors. For example, it is favorable to add oxygen that is made into a plasma state with a microwave at 2.45 GHz to the oxide semiconductor film 926.

The gate electrode layer 930 can be formed in such a manner that a conductive film is formed over the gate insulating film 929 and is then patterned.

The thickness of the gate electrode layer 930 is 10 nm to 400 nm, preferably 100 nm to 300 nm. In this example, the gate electrode layer 930 is formed in the following manner: a 135-nm-thick tungsten film is stacked over a 30-nm-thick tantalum nitride film by a sputtering method to form a conductive film for the gate electrode, and then, the conductive film is processed (patterned) into a desired shape by etching. Note that a resist mask may be formed by an inkjet method. Formation of the resist mask by an inkjet method needs no photomask; thus, manufacturing cost can be reduced.

Through the above process, the transistor 902 is formed.

Although the transistor 902 is described as a single-gate transistor, a multi-gate transistor which includes a plurality of gate electrodes electrically connected to each other so that a plurality of channel formation regions are formed can be fabricated as needed.

In the fabrication method described above, the source electrode layer 927 and drain electrode layer 928 are formed after the oxide semiconductor film 926. Accordingly, as illustrated in FIG. 10, in the transistor 902 obtained by the above fabrication method, the source electrode layer 927 and drain electrode layer 928 are formed over the oxide semiconductor film 926. Alternatively, in the transistor 902, the source electrode layer and drain electrode layer may be formed below the oxide semiconductor film 926, that is, between the oxide semiconductor film 926 and the insulating film 924.

Note that the insulating films in contact with the oxide semiconductor film 926 may be each formed using an insulating material containing an element that belongs to Group 13 and oxygen. Many oxide semiconductor materials contain an element that belongs to Group 13, and an insulating material containing an element that belongs to Group 13 works well with an oxide semiconductor. By using such an insulating material containing an element that belongs to Group 13 for the insulating films in contact with the oxide semiconductor film, the state of the interface with the oxide semiconductor film can be kept well.

The insulating material containing an element that belongs to Group 13 is an insulating material containing one or more elements that belong to Group 13. As the insulating material containing an element that belongs to Group 13, a gallium oxide, an aluminum oxide, an aluminum gallium oxide, and a gallium aluminum oxide are given, for example. Here, an aluminum gallium oxide refers to a material in which the amount of aluminum is larger than that of gallium in atomic percent, and a gallium aluminum oxide refers to a material in which the amount of gallium is larger than or equal to that of aluminum in atomic percent.

For example, by using a material containing a gallium oxide for the insulating films in contact with the oxide semiconductor film containing gallium, characteristics of the interfaces between the oxide semiconductor film and the insulating films can be kept favorable. When the oxide semiconductor film and the insulating films containing a gallium oxide are provided in contact with each other, pileup of hydrogen at the interface between the oxide semiconductor film and the insulating films can be reduced, for example. Note that a similar effect can be obtained in the case where an element in the same group as a constituent element of the oxide semiconductor film is used for the insulating films. For example, it is effective to form the insulating films with the use of a material including an aluminum oxide. Note that water is less likely to permeate an aluminum oxide, and it is therefore preferred to use a material containing an aluminum oxide in terms of preventing entry of water to the oxide semiconductor film.

The insulating films in contact with the oxide semiconductor film 926 are preferred to contain oxygen in a proportion higher than the stoichiometric composition by heat treatment in an oxygen atmosphere, oxygen doping, or the like. "Oxygen doping" refers to addition of oxygen into a bulk. Note that the term "bulk" is used in order to clarify that oxygen is added not only to a surface of a thin film but also to the inside of the thin film. In addition, "oxygen doping" includes "oxygen plasma doping" in which oxygen which is made to be plasma is added to a bulk. The oxygen doping may be performed by an ion implantation method or an ion doping method.

By the oxygen doping treatment, an insulating film that includes a region where the proportion of oxygen is higher than that in the stoichiometric composition can be formed. When the insulating film including such a region is in contact with the oxide semiconductor film, oxygen that exists excessively in the insulating film is supplied to the oxide semiconductor film, and oxygen vacancies in the oxide semiconductor film or at the interface between the oxide semiconductor film and the insulating film are reduced. Thus, the oxide semiconductor film can be made to be i-type or substantially i-type.

Note that the insulating film including a region where the proportion of oxygen is higher than that in the stoichiometric composition may be used as either the insulating film placed above the oxide semiconductor film 926 or the insulating film placed below the oxide semiconductor film 926 of the insulating films in contact with the oxide semiconductor film 926; however, it is preferred to use such an insulating film as both of the insulating films in contact with the oxide semiconductor film 926. The above-described effect can be enhanced with a structure where the insulating films including a region where the proportion of oxygen is higher than that in the stoichiometric composition are used as insulating films placed above and below the insulating films in contact with the oxide semiconductor film 926 so that the oxide semiconductor film 926 is provided between the insulating films.

The insulating films placed above and below the oxide semiconductor film 926 may contain the same constituent elements or different constituent elements. The insulating films in contact with the oxide semiconductor film 926 may be each a stack of insulating films each including a region where the proportion of oxygen is higher than that in the stoichiometric composition.

Note that in this example, the transistor 902 has a top-gate structure. The transistor 902 includes a back-gate electrode layer 923. With the back-gate electrode layer 923, normally-off characteristics of the transistor 902 can be further achieved. For example, when the potential of the back-gate electrode layer 923 is set at GND or a fixed potential, the threshold voltage of the transistor 902 can be further shifted in the positive direction and the transistor 902 can be further a normally-off transistor.

In order to form an electrical circuit by electrically connecting the transistor 901 and the transistor 902 to each other, wiring layers for connection having a single-layer structure or a stacked-layer structure are formed between levels and in the higher level.

In FIG. 10, one of the source and the drain of the transistor 901 is electrically connected to a wiring layer 914 through the contact plug 913. The other of the source and the drain of the transistor 901 is electrically connected to the wiring layer 916 through the contact plug 915. In addition, the gate of the transistor 901 is electrically connected to the drain electrode layer 928 of the transistor 902 through a contact plug 917, a wiring layer 918, a contact plug 921, a wiring layer 922, and a contact plug 925.

The wiring layers 914, 918, 916, and 922 and the back-gate electrode layer 923 are embedded in the insulating film. These wiring layers and the like are preferred to be formed using a low-resistance conductive material such as copper or aluminum. Alternatively, these wiring layers can be formed using graphene formed by a CVD method as a conductive material. Graphene is a one-atom thick sheet of $sp^2$-bonded carbon molecules or a stack of 2 to 100 sheets of carbon molecules. Examples of a method for fabricating such graphene are a thermal CVD method by which graphene is formed on a metal catalyst and a plasma CVD method by which graphene is formed from methane, without using a catalyst, by plasma generated locally with ultraviolet light irradiation.

By using such a low-resistance conductive material, RC delay of signals transmitted through the wiring layers can be reduced. When copper is used for the wiring layers, a barrier film is formed in order to prevent copper from diffusing into the channel formation region. The barrier film can be a tantalum nitride film, a stack of a tantalum nitride film and a tantalum film, a titanium nitride film, or a stack of a titanium nitride film and a titanium film, for example, but is not limited to a film containing such materials as long as the film has a function of preventing diffusion of a wiring material and has adhesion to the wiring material, a base film, or the like. The barrier film may be formed as a layer that is separate from the wiring layer, or may be formed in such a manner that a material of the barrier film is included in a wiring material and precipitated by heat treatment on the inner wall of an opening provided in the insulating film.

The insulating films 911, 912, 919, 920, and 933 can be formed using an insulator such as silicon oxide, silicon oxynitride, silicon nitride oxide, borophosphosilicate glass (BPSG), phosphosilicate glass (PSG), silicon oxide to which carbon is added (SiOC), silicon oxide to which fluorine is added (SiOF), silicon oxide made from Si(OC$_2$H$_5$)$_4$ (tetraethylorthosilicate: TEOS), an insulator made from hydrogen silsesquioxane (HSQ), an insulator made from methyl silsesquioxane (MSQ), organosilicate glass (OSG), or an organic polymer-based material. In particular, in the case of advancing miniaturization of a memory element, parasitic capacitance between wiring layers is significant and signal delay is increased; therefore, the insulating films 911, 912, 919, 920, and 933 are preferred to be formed using a material whose relative permittivity is less than the relative permittivity of silicon oxide (k=4.0 to 4.5), for example, a material where k is less than or equal to 3.0. In addition, CMP treatment is performed after the wiring layers are embedded in the insulating films; therefore, the insulating film needs to have high mechanical strength. As long as their mechanical strength can be secured, the insulating films can be made porous to have a lower dielectric constant. The insulating films are formed by a sputtering method, a CVD method, a coating method including a spin coating method (also referred to as spin on glass (SOG)), or the like.

An insulating film functioning as an etching stopper in the case of performing planarization treatment by CMP or the like may be additionally provided after the wiring material is embedded in the insulating films 911, 912, 919, 920, and 933.

Each of the contact plugs 913, 915, 917, 921, and 925 is formed in such a manner that an opening (a via hole) with a high aspect ratio is formed in the insulating film and is filled with a conductive material such as tungsten. The opening is preferred to be formed by highly anisotropic dry etching. In particular, a reactive ion etching (RIE) method is preferred to be used. A barrier film (diffusion prevention film) which is a titanium film, a titanium nitride film, a stacked layer of them, or the like is formed on an inner wall of the opening and a material such as tungsten or polysilicon doped with phosphorus is embedded in the barrier film. For example, tungsten can be embedded in the via hole by a blanket CVD method, and an upper surface of the contact plug is planarized by CMP.

Example 2

The memory element of one embodiment of the present invention can be used for electronic devices in a wide variety of fields, such as digital signal processing, software-defined radio systems, avionic systems (electronic devices used in aircraft, such as communication systems, navigation systems, autopilot systems, and flight management systems), ASIC prototyping, medical image processing, voice recognition, encryption, bioinformatics, emulators for mechanical systems, and radio telescopes in radio astronomy.

Examples of consumer products among such electronic devices are display devices, personal computers, and image reproducing devices provided with recording media (devices that reproduce the content of recording media such as digital versatile discs (DVDs) and have displays for displaying the reproduced images). Other examples of electronic devices that can include the memory element in one embodiment of the present invention are mobile phones, game consoles including portable game consoles, portable information terminals, e-book readers, cameras such as video cameras and digital still cameras, goggle-type displays (head mounted displays), navigation systems, audio reproducing devices (e.g., car audio systems and digital audio players), copiers, facsimiles, printers, and multifunction printers. FIGS. 11A to 11F illustrate specific examples of these electronic devices.

Figure 11A:
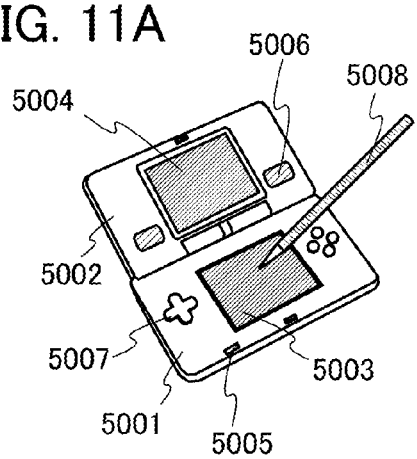
FIGS. 11A to 11F illustrate e specific examples of electronic devices.

FIG. 11A illustrates a portable game console. The portable game console illustrated in FIG. 11A includes a housing 5001, a housing 5002, a display portion 5003, a display portion 5004, a microphone 5005, a speaker 5006, an operation key 5007, a stylus 5008, and the like. Note that although the portable game console illustrated in FIG. 11A has the two display portions 5003 and 5004, the number of display portions included in the portable game console is not limited to two.

Figure 11B:
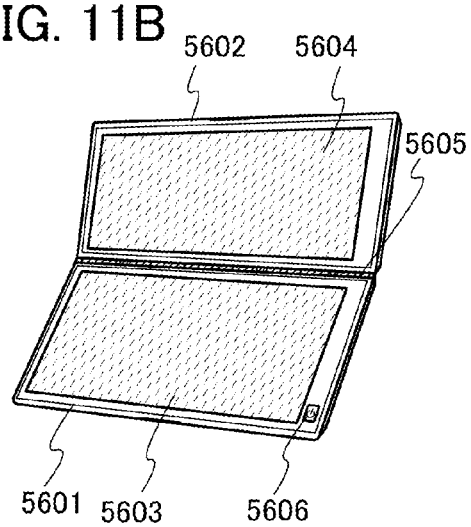

FIG. 11B illustrates a portable information terminal. The portable information terminal illustrated in FIG. 11B includes a first housing 5601, a second housing 5602, a first display portion 5603, a second display portion 5604, a connection portion 5605, an operation key 5606, and the like. The first display portion 5603 is provided in the first housing 5601, and the second display portion 5604 is provided in the second housing 5602. The first housing 5601 is connected to the second housing 5602 by the connection portion 5605, and the angle between the first housing 5601 and the second housing 5602 can be changed with the connection portion 5605. An image on the first display portion 5603 may be switched depending on the angle between the first housing 5601 and the second housing 5602 at the connection portion 5605. A display device with a position input function may be used as at least one of the first display portion 5603 and the second display portion 5604. Note that the position input function can be added by provision of a touch panel in the display device. Alternatively, the position input function can be added by provision of a photoelectric conversion element called a photosensor in a pixel portion of the display device.

Figure 11C:
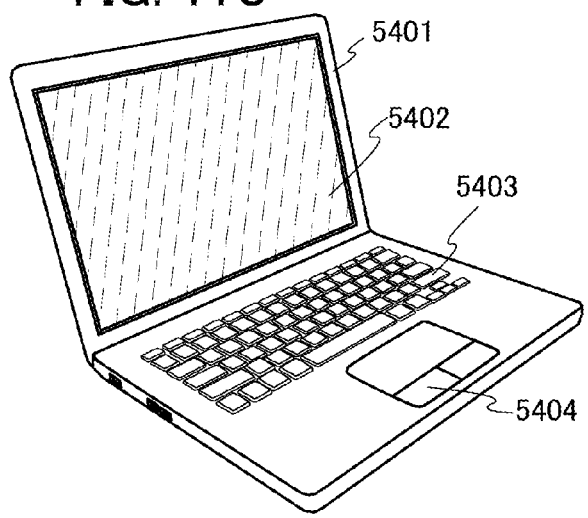

FIG. 11C illustrates a laptop personal computer. The laptop personal computer illustrated in FIG. 11C includes a housing 5401, a display portion 5402, a keyboard 5403, a pointing device 5404, and the like.

Figure 11D:
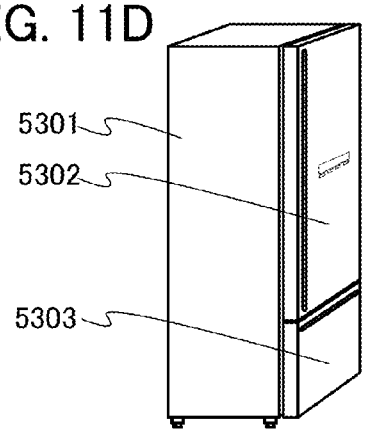

FIG. 11D illustrates an electric refrigerator-freezer. The electric refrigerator-freezer illustrated in FIG. 11D includes a housing 5301, a door for a refrigerator 5302, a door for a freezer 5303, and the like.

Figure 11E:
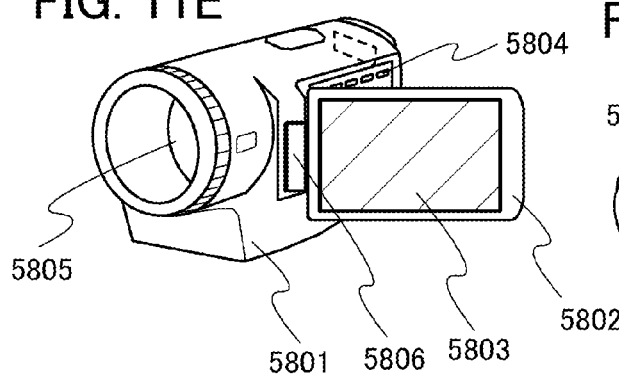

FIG. 11E illustrates a video camera. The video camera illustrated in FIG. 11E includes a first housing 5801, a second housing 5802, a display portion 5803, operation keys 5804, a lens 5805, a connection portion 5806, and the like. The operation keys 5804 and the lens 5805 are provided in the first housing 5801, and the display portion 5803 is provided in the second housing 5802. The first housing 5801 is connected to the second housing 5802 by the connection portion 5806, and the angle between the first housing 5801 and the second housing 5802 can be changed with the connection portion 5806. An image on the display portion 5803 may be switched depending on the angle between the first housing 5801 and the second housing 5802 at the connection portion 5806.

Figure 11F:
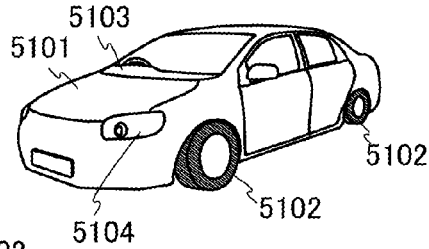

FIG. 11F illustrates an ordinary motor vehicle. The ordinary motor vehicle illustrated in FIG. 11F includes a car body 5101, wheels 5102, a dashboard 5103, lights 5104, and the like.

This application is based on Japanese Patent Application serial no. 2012-159449 filed with Japan Patent Office on Jul. 18, 2012, the entire contents of which are hereby incorporated by reference.

What is claimed is:

1. A semiconductor device comprising:
   a first wiring configured to supply a high power source potential and a low power source potential;
   a second wiring configured to supply the high power source potential;
   a third wiring configured to supply the high power source potential and the low power source potential;
   a first n-channel transistor, one of a source and a drain of which is electrically connected to the first wiring;

a second n-channel transistor, a gate of which is electrically connected to the second wiring, one of a source and a drain of which is electrically connected to the third wiring, and the other of the source and the drain of which is electrically connected to a gate of the first n-channel transistor; and a node which is electrically connected to the other of the source and the drain of the first n-channel transistor, wherein the node is brought into a floating state by turning off the first n-channel transistor.

2. The semiconductor device according to claim 1, wherein the first n-channel transistor is a transistor a channel of which is formed in an oxide semiconductor layer.

3. The semiconductor device according to claim 2, wherein the second n-channel transistor is a transistor a channel of which is formed in an oxide semiconductor layer.

4. The semiconductor device according to claim 2, wherein a mobility of the second n-channel transistor is higher than a mobility of the first n-channel transistor.

5. The semiconductor device according to claim 1, wherein a withstand voltage of the first n-channel transistor is higher than a withstand voltage of the second n-channel transistor.

6. The semiconductor device according to claim 1 further comprising a third transistor a gate of which is electrically connected to the node.

7. The semiconductor device according to claim 6, wherein a mobility of the third transistor is higher than a mobility of the first n-channel transistor and a mobility of the second n-channel transistor.

8. The semiconductor device according to claim 6, wherein a withstand voltage of the first n-channel transistor and a withstand voltage of the second n-channel transistor are higher than a withstand voltage of the third transistor.

9. The semiconductor device according to claim 6 further comprising a fourth transistor, one of a source and a drain of which is electrically connected to one of a source and a drain of the third transistor.

10. The semiconductor device according to claim 9,
wherein a mobility of the third transistor is higher than a mobility of the first n-channel transistor and a mobility of the second n-channel transistor, and
wherein a mobility of the fourth transistor is higher than the mobility of the first n-channel transistor and the mobility of the second n-channel transistor.

11. The semiconductor device according to claim 1, wherein a potential of the gate of the first n-channel transistor can be higher than the high power source potential.

12. A semiconductor device comprising:
a first wiring configured to supply a high power source potential and a low power source potential;
a second wiring configured to supply the low power source potential;
a third wiring configured to supply the high power source potential and the low power source potential;
a first p-channel transistor, one of a source and a drain of which is electrically connected to the first wiring;
a second p-channel transistor, a gate of which is electrically connected to the second wiring, one of a source and a drain of which is electrically connected to the third wiring, and the other of the source and the drain of which is electrically connected to a gate of the first p-channel transistor; and
a node which is electrically connected to the other of the source and the drain of the first p-channel transistor,
wherein the node is brought into a floating state by turning off the first p-channel transistor.

13. The semiconductor device according to claim 12, wherein a mobility of the second p-channel transistor is higher than a mobility of the first p-channel transistor.

14. The semiconductor device according to claim 12, wherein a withstand voltage of the first p-channel transistor is higher than a withstand voltage of the second p-channel transistor.

15. The semiconductor device according to claim 12 further comprising a third transistor a gate of which is electrically connected to the node.

16. The semiconductor device according to claim 15, wherein a mobility of the third transistor is higher than a mobility of the first p-channel transistor and a mobility of the second p-channel transistor.

17. The semiconductor device according to claim 15, wherein a withstand voltage of the first p-channel transistor and a withstand voltage of the second p-channel transistor are higher than a withstand voltage of the third transistor.

18. The semiconductor device according to claim 15 further comprising a fourth transistor, one of a source and a drain of which is electrically connected to one of a source and a drain of the third transistor.

19. The semiconductor device according to claim 18,
wherein a mobility of the third transistor is higher than a mobility of the first p-channel transistor and a mobility of the second p-channel transistor, and
wherein a mobility of the fourth transistor is higher than the mobility of the first p-channel transistor and the mobility of the second p-channel transistor.

20. The semiconductor device according to claim 12, wherein a potential of the gate of the first p-channel transistor can be lower than the low power source potential.

* * * * *